US006888973B2

(12) United States Patent
Kolodziejski et al.

(10) Patent No.: US 6,888,973 B2
(45) Date of Patent: May 3, 2005

(54) TUNABLE OPTICAL ADD/DROP MULTIPLEXER WITH MULTI-FUNCTION OPTICAL AMPLIFIERS

(75) Inventors: Leslie Kolodziejski, Belmont, MA (US); Gale S. Petrich, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/294,076

(22) Filed: Nov. 14, 2002

(65) Prior Publication Data

US 2003/0128922 A1 Jul. 10, 2003

Related U.S. Application Data

(60) Provisional application No. 60/332,242, filed on Nov. 14, 2001.

(51) Int. Cl.[7] .................................................. G02B 6/12
(52) U.S. Cl. ............................. 385/14; 385/10; 385/16
(58) Field of Search .............................. 385/10, 14, 16

(56) References Cited

U.S. PATENT DOCUMENTS

| 5,608,572 | A | | 3/1997 | Nitta et al. | |
|---|---|---|---|---|---|
| 6,243,401 | B1 | | 6/2001 | Lee | |
| 6,310,969 | B1 | | 10/2001 | Kim et al. | |
| 6,330,254 | B1 | * | 12/2001 | Hung | 372/20 |
| 6,330,378 | B1 | | 12/2001 | Forrest et al. | |
| 6,333,941 | B1 | * | 12/2001 | Hung | 372/20 |
| 6,424,763 | B1 | | 7/2002 | Villeneuve et al. | |
| 6,567,573 | B1 | * | 5/2003 | Domash et al. | 385/16 |

FOREIGN PATENT DOCUMENTS

| EP | 0 238 082 | 3/1987 |
|---|---|---|
| EP | 0 818 894 | 1/1998 |
| WO | WO 97/15851 | 5/1997 |
| WO | WO 01/31387 | 5/2001 |
| WO | WO 01/61903 | 8/2001 |
| WO | WO 01/81962 | 11/2001 |

OTHER PUBLICATIONS

"Integrated Real Time Multi–channel wavelength monitoring circuit using phased–array waveguide grating," Zhong et al. *Optical Fiber Communication Conference and the International Conference on Integrated Optics and Optical Fiber Communications.* Feb., 1999. San Diego, CA.

* cited by examiner

Primary Examiner—John R. Lee
Assistant Examiner—Paul M. Gurzo
(74) Attorney, Agent, or Firm—Gauthier & Connors LLP

(57) ABSTRACT

A photonic circuit includes a tunable drop filter arrangement that includes a plurality of resonators. The drop filter arrangement is tuned to remove a selected frequency from an input data stream from a waveguide. A wavelength sensor coupled to the drop filter to monitor the selected frequency to which the drop filter arrangement has been tuned. A tunable laser presents a new signal of a defined frequency indicative of a signal to be added to the input data stream. A modulator coupled to the tunable laser for receiving the new signal and forming a modulated signal. An add filter arrangement coupled to the modulator for receiving the modulated signal and adding the modulated signal to the data stream.

27 Claims, 20 Drawing Sheets

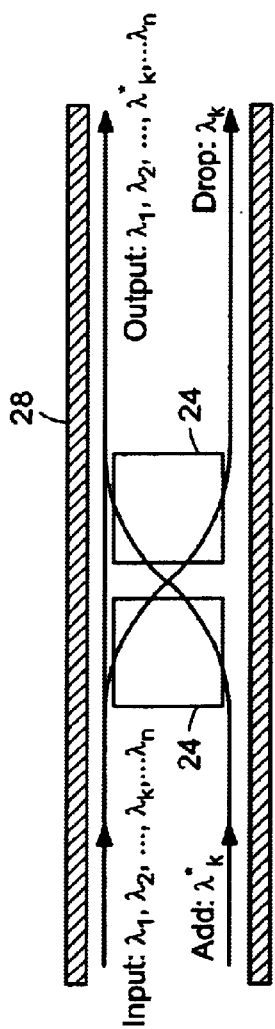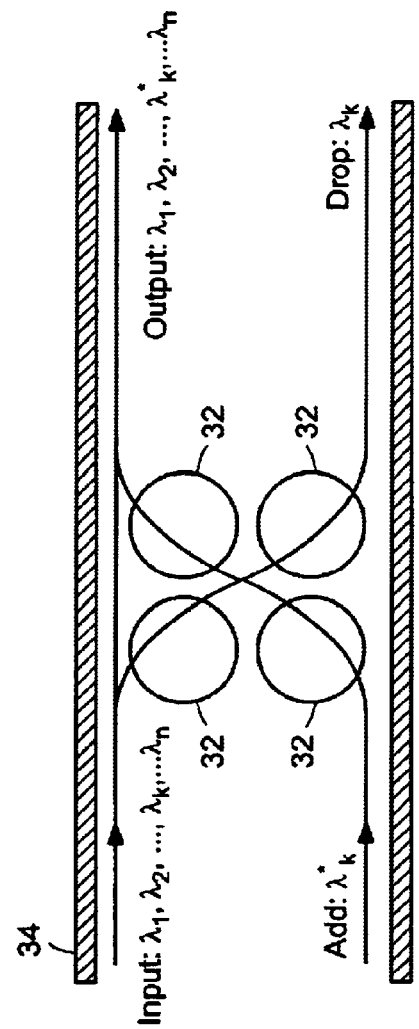
FIG. 2A
FIG. 2B

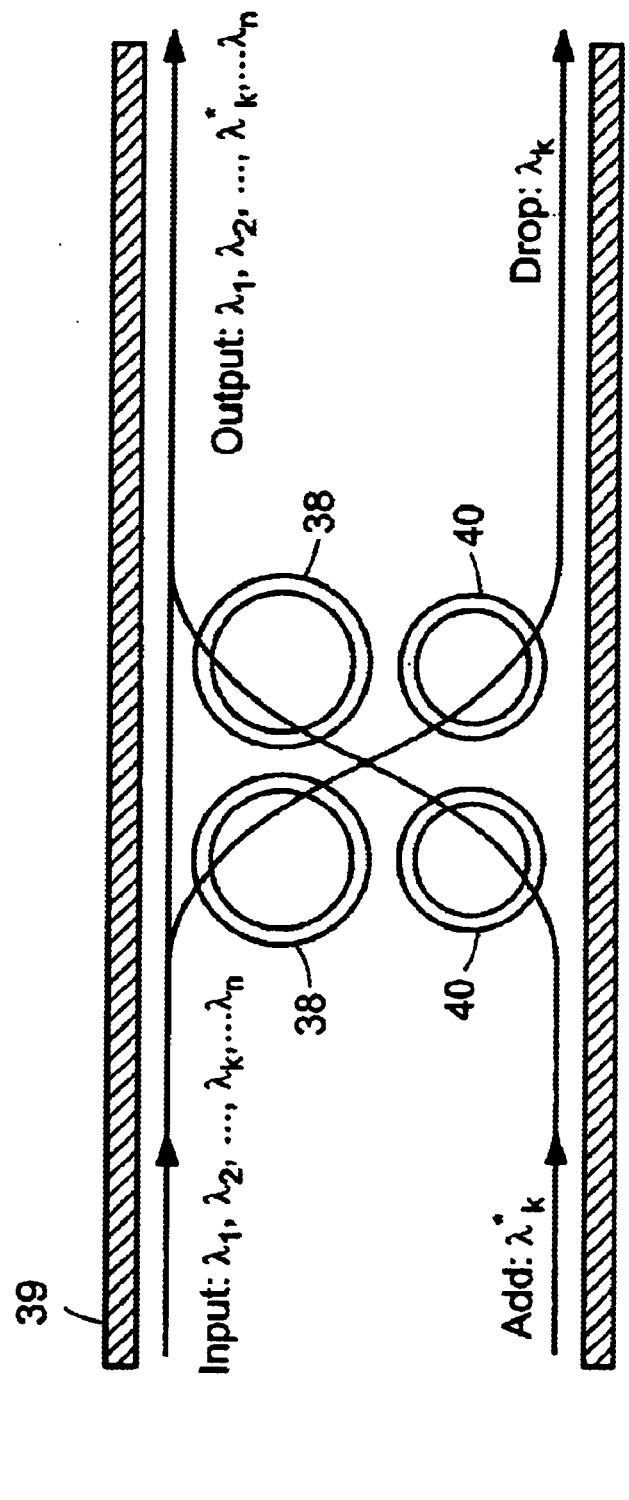

TUNABLE OPTICAL ADD/DROP MULTIPLEXER WITH MULTI-FUNCTION OPTICAL AMPLIFIERS

PRIORITY INFORMATION

This application claims priority from provisional application Ser. No. 60/332,242 filed Nov. 14, 2001, the disclosure of which is incorporated herein by reference.

BACKGROUND OF THE INVENTION

The invention relates to the field of integrated photonic circuits including tunable add/drop filters, a detector, a wavelength sensor, a modulator, and a tunable laser for use in telecommunication systems and networks.

Currently, many photonic functional blocks are discrete and are not monolithically integrated together. To create photonic circuits, hybrid integration approaches have been used when dealing with the integration of several functional blocks.

The need to remove information from and add information to dense wavelength division multiplexing (DWDM) data streams can be vital to optical networks. Tunable add/drop filters allow any wavelength within the DWDM data stream to be extracted and allow the wavelength tobe added back into the DWDM data stream. To be useful, the information contained in the dropped (removed) optical signal must be converted to an electrical signal via the use of detectors. Similarly, an electrical signal must be converted to an optical signal to allow the information to be transported optically in a DWDM data stream. In deployed optical networks, the functions of dropping, adding, detecting, and modulating individual optical signals are performed using discrete components. For example, various add/drop filters are employed using thin films, array waveguides, and tunable filters such as ones described in U.S. Pat. No. 6,310,969, U.S. Pat. No. 6,424,763 and coupled resonators. The conversion of optical signals to electrical signals is accomplished by photodiodes and phototransistors connected to transimpedance amplifiers. Conversely, the conversion of an electrical signal to an optical signal can be accomplished by the direct modulation of discrete tunable lasers or by the modulation of a tunable continuous optical signal using a discrete modulator.

SUMMARY OF THE INVENTION

According to one aspect of the invention, there is provided a photonic circuit. The photonic circuit includes a tunable drop filter arrangement that includes a plurality of resonators. The drop filter arrangement removes a dropped resonant frequency from an input data stream. A wavelength sensor is coupled to the drop filter to monitor the dropped resonant frequency associated with the tunable drop filter arrangement.

According to another aspect of the invention, there is provided a device for operating on an optical signal. The device includes a tunable drop filter arrangement that includes a plurality of resonators. The drop filter arrangement removes a dropped resonant frequency from an input data stream. A wavelength sensor is coupled to the drop filter to monitor the dropped resonant frequency associated with the tunable drop filter arrangement.

According to another aspect of the invention, there is provided a photonic circuit. The photonic circuit includes a tunable drop filter arrangement that includes a plurality of resonators. The drop filter arrangement is tuned to remove a selected frequency from an input data stream from a waveguide. A wavelength sensor is coupled to the drop filter to monitor the selected frequency that the drop filter arrangement has been tuned. A tunable laser presents a new signal of a defined frequency, which is to be added to the data stream. An add filter arrangement, that is coupled to the modulator, receives the modulated signal and adds the modulated signal to the signal data stream.

According to another aspect of the invention, there is provided a device for operating on an optical signal. The device includes a tunable drop filter arrangement that includes a plurality of resonators. The drop filter arrangement is tuned to remove a selected frequency from an input data stream from a waveguide. A wavelength sensor is coupled to the drop filter so that it monitors the selected frequency to which the drop filter arrangement has been tuned. A tunable laser presents a new signal of a defined frequency, which is to be added to the data stream. An add filter arrangement, that is coupled to the modulator, receives the modulated signal and adds the modulated signal to the signal data stream.

According to another aspect of the invention, there is provided a method of dropping a resonant frequency from an input data stream using a photonic circuit. The method includes providing a tunable drop filter arrangement that includes a plurality of resonators, the drop filter arrangement removes the dropped resonant frequency from the input data stream. The method also includes providing a wavelength sensor that is coupled to the drop filter so that it monitors the dropped resonant frequency associated with the tunable drop filter.

According to yet another aspect of the invention, there is provided a method of performing add/drop multiplexing on an input data stream. The method includes providing a tunable drop filter arrangement that includes a plurality of resonators, the drop filter arrangement removes the dropped resonant frequency from the input data stream. The method also includes providing a wavelength sensor that is coupled to the drop filter so that it monitors the dropped resonant frequency associated with the tunable drop filter. Moreover, the method includes providing a tunable laser that presents a new signal of a defined frequency, which is to be added to the data stream. A modulator is provided that receives the new signal and forms a modulated signal. Furthermore, the method includes providing an add filter arrangement, that is coupled to the modulator, receiving the modulated signal and adding the modulated signal to the data stream.

BRIEF DESCRIPTION OF THE DRAWINGS

FIGS. 2A–2B are schematic diagrams of tunable optical add/drop filters used in accordance with the invention;

FIG. 3 is a schematic diagram of an exemplary OADF including two pairs of resonators of different sizes;

DETAILED DESCRIPTION OF THE INVENTION

Figure 1:
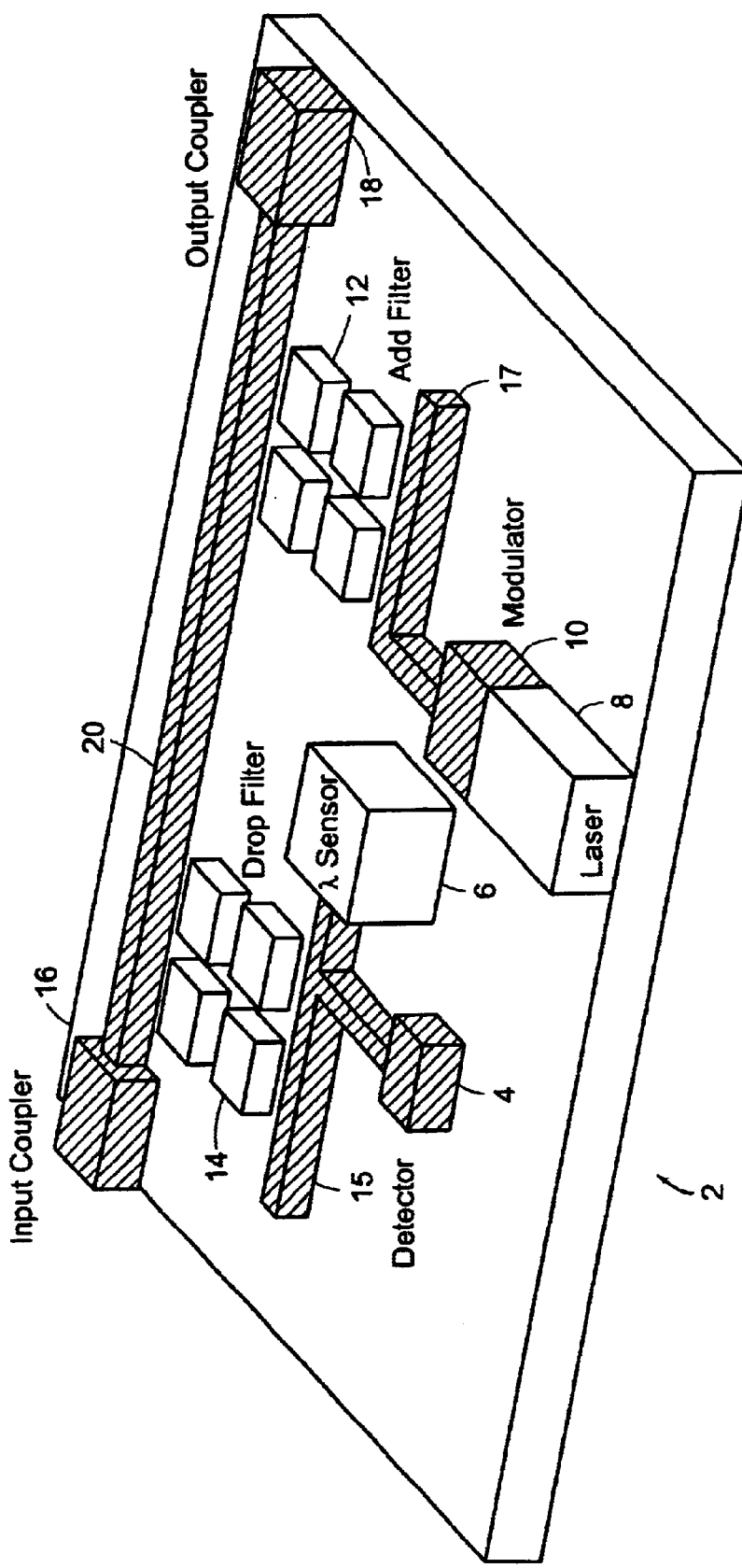
FIG. 1 is a schematic block diagram of a photonic circuit used in accordance with the invention.

FIG. 1 is a schematic block diagram of a photonic circuit 2 used in accordance with the invention. The invention involves the integration of the components necessary to drop or remove any wavelength from a DWDM data stream, to convert it to an electrical signal, to sense and maintain the dropped wavelength, to add any wavelength to the data stream, to modulate the optical signal that is to be added, and to create the optical signal.

The photonic circuit 2 includes a waveguide 20 that terminates with input 16 and output 18 couplers. Along the length of this waveguide resides an optical drop filter 14 and an optical add filter 12. The optical drop filter 14 resides between the optical add filter 12, and input coupler 16. Similarly, the optical add filter 12 resides between the optical drop filter 14 and output coupler 18. In this embodiment, the optical add/drop filters 12 and 14 are composed of two pairs of resonators. The output waveguide 15 of the optical drop filter 14 is connected to a wavelength sensor 6 and to a detector 4. The output waveguide 17 of the optical add filter 12 is connected to a modulator 10 and a laser 8 in that order. The electrical circuitry required to operate the detector, optical add/drop filters, the wavelength sensor, the modulator and the laser is not shown for brevity and clarity. Also, the electrical circuitry can be attached to the various functional blocks via a hybrid approach or monolithically integrated. The entire integrated photonic circuit 2 can reside on a III–V compound semiconductor such as GaAs or InP.

The invention is dependent upon the successful confinement of light within the waveguides, which are required to allow the light to be guided from one optical functional block to the next functional block. A waveguide includes a material with a dielectric constant that is higher than its surrounding and that has a cross section on the order of a wavelength of the light that is to be guided. The guided light travels in the direction of the cross section's normal. In addition, the waveguide cross section is typically square or rectangular. Given a waveguide, the dielectric constant of the surrounding material may not be uniform such that, for example, the dielectric constant of the material above the waveguide could be different than the dielectric constant of the material below the waveguide. In addition, the dielectric constant of the material to the right or to the left of the waveguide can be the same or completely different than the dielectric constant of the material above or beneath the waveguide.

The waveguide is sized such that it will confine only one mode of the wavelength of light that is propagating through the waveguide. As an example, a waveguide can be comprised of GaAs (dielectric constant=11.357) surrounded by air (dielectric constant=1). A second example can be where the material beneath a GaAs waveguide is aluminum oxide (dielectric constant=2.56) or aluminum gallium arsenide (dielectric constant=8.35 to 11.357 depending on the aluminum content) while being surrounded by air in the remaining directions.

One of the functional blocks of the invention is a tunable optical add/drop filter (OADF). FIGS. 2A–2B are schematic diagrams of tunable optical add/drop filters (OADF) used in accordance with the invention. The OADF includes two sub functions: the drop portion and add portion. Functionally, each portion of the OADF is similar. The essence of each portion is a frequency selective device that interacts with the WDM signal. The frequency selective device can be a grating or a resonator. Monolithically integrated OADFs can include two waveguides side coupled to resonators where one waveguide serves as the WDM input signal bus while the other waveguide serves as the drop or add bus. The resonator can be constructed from gratings etched into waveguides, or can also be constructed from microcavities within photonic band gap crystals, rings, or cavities composed of solid geometric shape, such as a circle or square.

All implementations of an OADF share several common features. First, the resonator is bounded by material with a lower dielectric constant. As with a waveguide, the material beneath the resonator can be different from the material above the resonator, which may or may not be the same as the material adjacent to the resonator. Secondly, each resonator supports at least one mode. Thirdly, to achieve complete add/drop capability, an even number of resonators is required in which each pair of resonators supports at least two system modes, which are formed in part by a linear combination of resonator modes. Also, at least one pair of resonators is coupled to the input waveguide. The add/drop waveguide is coupled to at least one pair of resonators. The coupling between the waveguides and the resonators occurs when the resonator modes have the same resonant frequency and the same overall decay rate. Furthermore, the resonant frequency depends on the size and the dielectric constant of the resonators, and can be changed using various physical phenomena, such as current injection, the thermo-optical effect, or the electro-optical effect.

The OADF overall response is dependent upon the number of pairs of resonators. The simplest OADF includes a pair of resonators 24 that couple to both waveguides, as shown in FIG. 2A. The frequency response of this filter 22 can be described as a single pole filter. The resonators 24 exhibit the same resonant frequency and interact evanescently with the two waveguides. In this case, the resonators are rectangular. The arrows in FIG. 2A show the relative direction of the various optical signals in which wavelength $\lambda_k$ is dropped and wavelength $\lambda_k^*$ is added.

As the number of pairs of resonators is increased, the rate of optical attenuation is increased as the frequency of the light moves away from the resonant frequency. OADFs with multiple pairs of resonators can be described as a multipoled filter in which the number of poles in the filter response is equal to the number of pairs of resonators. FIG. 2B shows an OADF 30 having two pairs of resonators between the waveguides. The filter response of the OADF shown in FIG. 2B can be described as a filter with two poles.

FIG. 3 is a schematic diagram of an OADF having two pairs of resonators of different sizes. The OADF resonant frequency depends on the resonant frequency of each pair of resonators. For OADFs constructed from resonators composed from microcavities within photonic band gap crystals, rings, cavities composed of a solid geometric shape, such as a circle or square, or sampled Bragg gratings, each resonator will exhibit multiple resonant frequencies. The distance between each resonant frequency is known as the free spectral range. If each pair of resonators is identical, then there will be a coupling between the input/output waveguide at all the resonant frequencies. However, if the pairs of resonators are different, then only the frequencies that overlap between all of the pairs of resonators will couple to both waveguides. Hence, the overall OADF's free spectral range increases.

FIG. 3 shows an OADF 36 having two pairs of resonators 38 and 40 that have different sizes. By modifying the frequency response of all the resonators 38 and 40 equivalently, the overall system resonant frequency can be changed smoothly and continuously. However, by modifying the frequency response of a single pair of resonators 38 or 40, the overall overlap between the pairs 38 and 40 will change. Therefore, using this vernier effect can significantly change the overall system resonant frequency. The induced difference between the pairs of resonators 38 and 40 can be simply a change in the overall size of the resonator, or a change in the dielectric constant of the resonator. To create a monolithic widely tunable OADF with a large free spectral range, the OADF requires resonators that are physically different and can be modified or tweaked during operation using physical effects, such as current injection.

In this embodiment, the resonators 38 and 40 are rings. The arrows in the FIG. 3 show the relative directions of the various optical signals in which wavelength $\lambda_k$ is dropped and wavelength $\lambda_k^*$ is added.

Figure 4A:
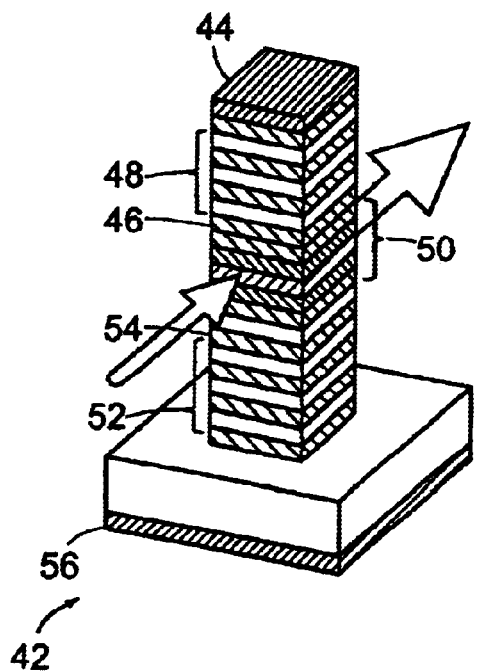
FIGS. 4A–4B are schematic block diagrams of a semiconductor optical amplifier (SOA) used in accordance with the invention.
Figure 4B:
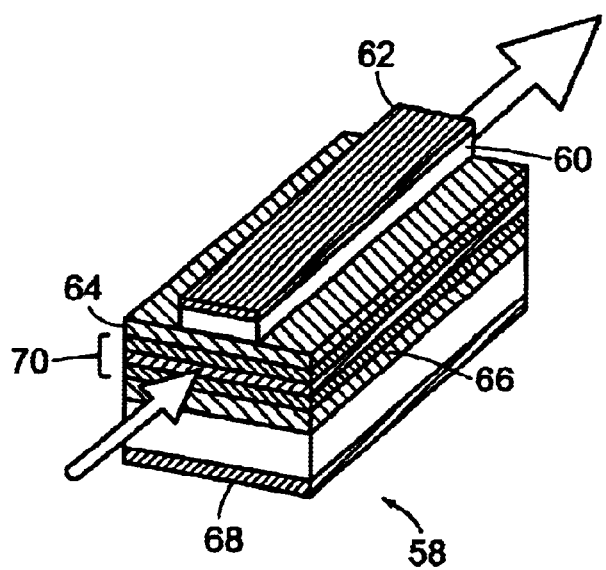

FIGS. 4A–4B are schematic block diagrams of a semiconductor optical amplifier (SOA) used in accordance with the invention. The SOA is a second functional block used within the invention. The SOA includes an active region with a dielectric constant higher than the surrounding material. The active region can include quantum wells or quantum dots and is bounded above and below by a cladding material with a dielectric constant higher than its surrounding but lower than the active region. Moreover, the active region and cladding layers create a waveguide in order to guide the light that is to be amplified through the device. The materials above and below the cladding material are doped n-type or p-type in order to form a diode structure. By applying a forward bias to the diode structure, carriers are injected into the active region creating an environment with population inversion, which allows the light traveling through the SOA to be amplified.

The SOA can also be used as a detector. The wavelengths that are absorbed by the active region depend on both the bandgap of the material within the active region and the bias across the active region. The absorption edge can be adjusted via the Stark effect.

Due to the ability of the SOA to absorb light, the SOA can also be used as a wavelength sensor. The wavelength sensor is used to monitor the frequency of light that passes within its structure. As light is absorbed in the active region, it creates excess electron-hole pairs. These extra carriers will change the voltage across the PN junction. By modulating the current bias through the diode, measuring the resulting voltage, and knowing the physical properties of the active material, the wavelength of the absorbed light can be determined.

Since the SOA can amplify or absorb light, the SOA structure can also be used as a modulator. In one embodiment, by modulating the electrical bias on a SOA, the SOA can either absorb light or transmit/amplify light. In a second embodiment, an SOA can be used to modify the phase of the light traveling through one arm of a Mach-Zenhder interferometer. Using the SOA to change the phase of the light by 180 degrees, the light will destructively intefere with the light being transmitted through the other arm of the interferometer. Hence, the intensity of the light being transmitted through the interferometer can be modulated.

A SOA can be fabricated in two different configurations as shown in FIGS. 4A and 4B. FIG. 4A shows a vertical cavity semiconductor optical amplifier (VCSOA) 42. The VCSOA 42 includes an upper 48 and a lower 52 distributed Bragg reflectors, an active region 50, an upper 46 and a lower 54 cladding layers, and metal contacts 44 and 56. Moreover, the VCSOA 42 includes a current aperture layer comprising of partially oxidized AlGaAs for GaAs-based VCSOA. For InP based VCSOA, the current aperture layer can be a partially etched layer of InGaAlAs.

FIG. 4B shows a traditional semiconductor optical amplifier (SOA) 58. In this case, the SOA 58 includes a ridge waveguide 60, upper 64 and lower 66 cladding layers, active section 70, and metal contacts 62 and 68. In both cases, the facets have anti-reflective coatings.

Figure 5:
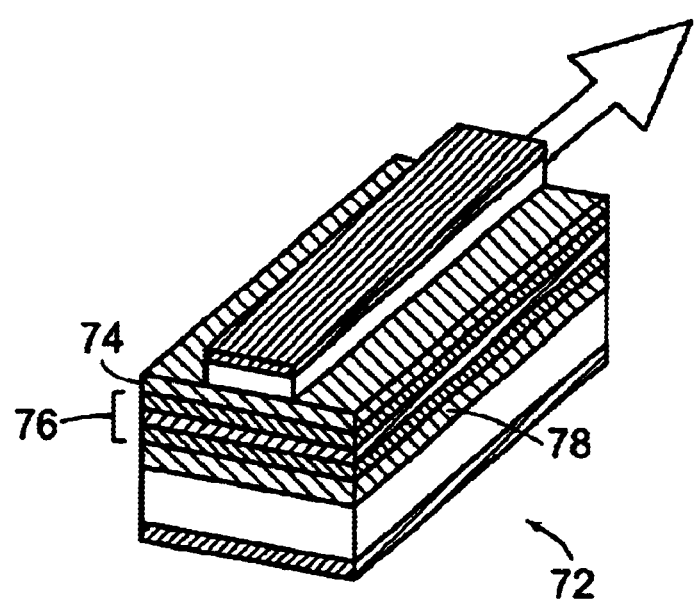
FIG. 5 is a schematic diagram of a semiconductor laser diode.

FIG. 5 is a schematic diagram of a semiconductor laser diode 72. The semiconductor laser diode includes an active region 76 that has a dielectric constant higher than the surrounding material and that provides optical gain. The active region 76 can include quantum wells or quantum dots that are bounded above and below by a cladding material with a dielectric constant higher than its surrounding but lower than the active region. The active region 76 and cladding layers 74 and 78 create a waveguide in order to guide the light within the device. Furthermore, the active region 76 resides within a cavity that provides optical feedback. The material above and below the waveguide is doped n-type or p-type in order to form a PN junction. By forward biasing the PN junction, carriers are injected into the active region 76 leading to the spontaneous emission of photons that with enough feedback and gain leads to the amplification of light by stimulated emission.

The optical feedback mechanism controls the emission wavelength of a laser diode. Through the use of frequency selective feedback, the emission wavelength can be controlled. In one embodiment, having the propagating optical field within the laser interact with a grating etched into the structure creates frequency selective feedback. Since the optical mode physically extends beyond the dimensions of the active region, the gratings can be etched above, below, or even next to the active region. Semiconductor layers that use gratings to provide feedback are known as distributed feedback (DFB) lasers if the gratings are placed in the same region where light amplification occurs. The reflectivity spectrum of the continuous grating exhibits a single region of high reflectivity whose magnitude and frequency are determined by the physical properties of the gratings. For example, the grating period determines the frequency at which the mirror has the highest reflectivity. The depth of the grating determines the width of the high reflectivity band.

Figure 6A:
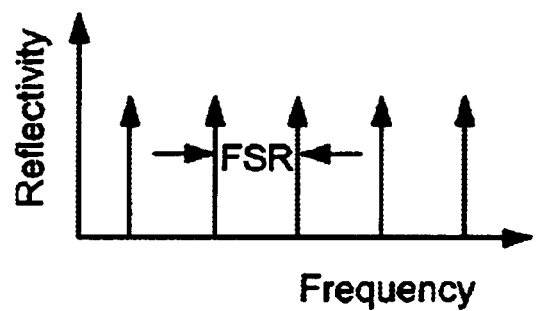
FIGS. 6A–6C are graphs illustrating two frequency combs with two different spectral ranges.
Figure 6B:
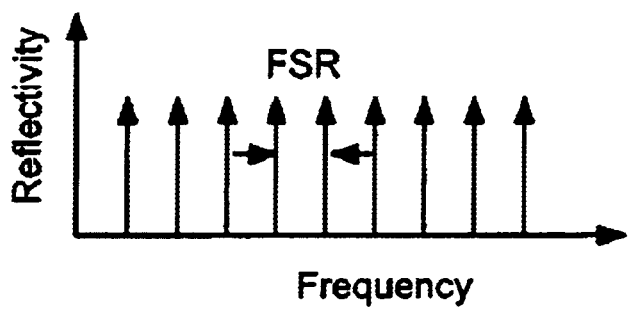
Figure 6C:
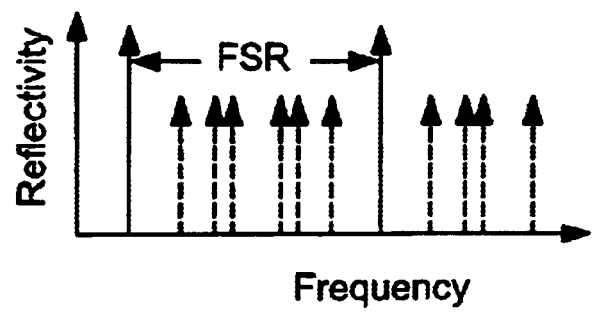

FIGS. 6A–6C are graphs illustrating two frequency combs with two different spectral ranges. By changing the optical feedback mechanism, the emission wavelength can be varied. In the simplest embodiment, the frequency response of the feedback mechanism as shown in FIGS. 6A and 6B consists of a frequency comb that is created by structures, such as sampled Bragg gratings and circular resonators. By having the light within the cavity experience two slightly different feedback mechanisms whose frequency response can be described as a frequency comb, it is possible to vary the emission wavelength using the vernier effect.

FIGS. 6A and 6B illustrate two frequency combs with two different free spectral ranges. FIG. 6C demonstrates the overlap between the two frequency combs shown in FIGS. 6A and 6B. The free spectral range of the overlap is larger than the free spectral ranges of the individual frequency combs. By slightly shifting one of the frequency combs, the peak reflections can be varied.

Figure 7A:
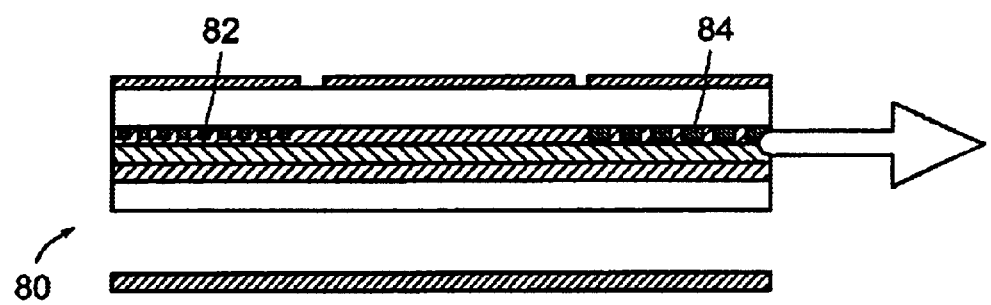
FIGS. 7A and 7B are schematic block diagrams of a tunable laser used in accordance with the invention.
Figure 7B:
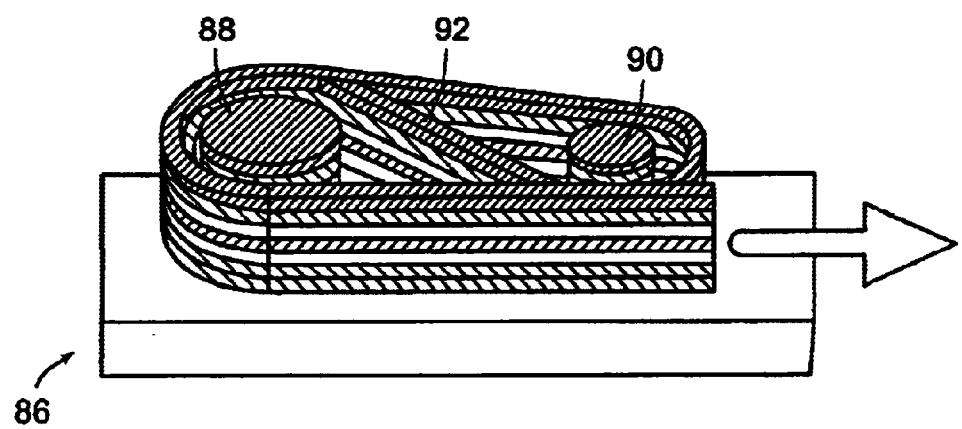

FIGS. 7A and 7B are schematic block diagrams of a tunable laser used in accordance with the invention. FIG. 7A shows a tunable laser 80 having two sampled gratings 82 and 84 with slightly different sampling periods to provide the optical feedback necessary to create a cavity. The frequency response of the gratings can be varied using various physical means such as current injection, the thermo-optical effect, or the electro-optical effect. A similar type of tunable laser uses a grating to couple between two waveguides in order to tune the emission wavelength.

FIG. 7B shows a tunable laser 86 having a two-sided coupled resonators 88 and 90 of different sizes that provide the necessary feedback in order to tune the emission wavelength of a cavity using a ring structure. Lasers constructed from ring-based cavities have been used to create various fixed wavelength light sources. Ring lasers, in general, will have clock-wise and counter-clock-wise propagating waves in the same manner as light propagates back and forth between the mirrors in conventional lasers. In both of the lasers 80 and 86 discussed, only one propagating wave can exit the cavity. However, in ring lasers, a wave propagating clockwise (CW) can be promoted at the expense of the counter-clockwise (CCW) propagating wave and vice versa.

As shown in FIG. 7B, the cross waveguide 92 connecting the top and bottom of the ring promotes the CCW propagating wave. Since the side-coupled resonators 88 and 90 support only modes that exhibit an integer number of wavelengths around its periphery, the frequency of response of such resonators 88 and 90 exhibits a comb-like behavior. By changing the dielectric constant of the resonator 88 or 90 using such physical phenomena as current injection, thermo-optical, or electro-optical, the frequency response of the resonator 88 or 90 can be varied. As the frequency response of the optical feedback mechanism is varied, the emission wavelength of the laser varies.

One uniqueness of the invention is the monolithic integration of the tunable add/drop filters, a detector, a wavelength sensor, a modulator, and a tunable laser. The integration of these components can be accomplished by aligning the various active sections within each functional block to each other. However, the active section of the laser, wavelength sensor, detector, and modulator will absorb some of the wavelengths within the WDM data stream. Therefore, if this active layer is used as the main waveguide that connects the photonic integrated circuit's input to its output, the intensity of some of the wavelengths at the output could potentially be severely degraded. This leads to a lower optical signal to noise ratio that could potentially lead to the loss of data.

To alleviate this attenuation, a "passive" waveguide can be used, which is transparent to the wavelengths within the WDM data stream. This "passive" waveguide must guide the WDM data stream so that the waveguide layer is surrounded by material with a lower dielectric constant. Therefore, in this embodiment, there are two primary waveguides: the "passive" waveguide that is used in the routing of optical signals, and an "active" waveguide that is used in the detection, modulation, and generation of optical signals. In the case of a detector, the "active" waveguide absorbs the optical signal.

These types of waveguide arrangements have been used to connect a limited number of functional blocks together, such as lasers to modulators, lasers to passive waveguides, as well as lasers to detectors. In the tunable add/drop filter, the filter's resonators are composed of the same materials as the "passive" waveguide since the filter should not attenuate the optical signal. In the modulator and wavelength sensor, both of which use the "active" waveguide material in their active sections, the "active" waveguide's absorption is modulated, and in the laser, the "active" waveguide is used to generate an optical signal. Since both the "active" and "passive" waveguides are surrounded by material with a lower effective dielectric constant, the surrounding material around each waveguide must be carefully controlled. For example, to cause the optical signals to transfer between the "active" and "passive" waveguides, a coupling region must exist.

In one embodiment, the materials creating the "passive" waveguide have a higher effective dielectric constant than the materials comprising the "active" waveguide. Thus, given the same physical geometry, most of the light's intensity will be confined to the "passive" waveguide as desired. As the effective dielectric constant of the "passive" waveguide is decreased below the effective dielectric constant of the "active" waveguide, the optical signal couples to and eventually transfers to the "active" waveguide. The cross section of the "passive" waveguide and hence the effective dielectric constant can be varied using lateral tapers, vertical tapers, and/or a combination of these two methods. Thus, through the use of couplers, the optical signal can interact with the active sections of each functional block.

In a variation of this embodiment, the materials creating the "active" waveguide have a higher effective dielectric constant than the materials comprising the "passive" waveguide. Thus, given the same physical geometry, most of the light's intensity will be confined to the "active" waveguide. As the effective dielectric constant of the "active" waveguide is decreased below the effective dielectric constant of the "passive" waveguide, the optical signal couples to and eventually transfers to the "passive" waveguide. The cross section of the "active" waveguide and hence the effective dielectric constant can be varied using lateral tapers, vertical tapers, and/or a combination of these two methods.

The use of SOAs, with the primary input to output waveguide, reduces the insertion losses. Furthermore, the ability to amplify the signal prior to filtering makes the overall system more robust in term of polarization sensitivity. The SOA can be designed to compensate for any loss due to polarization.

Figure 8A:
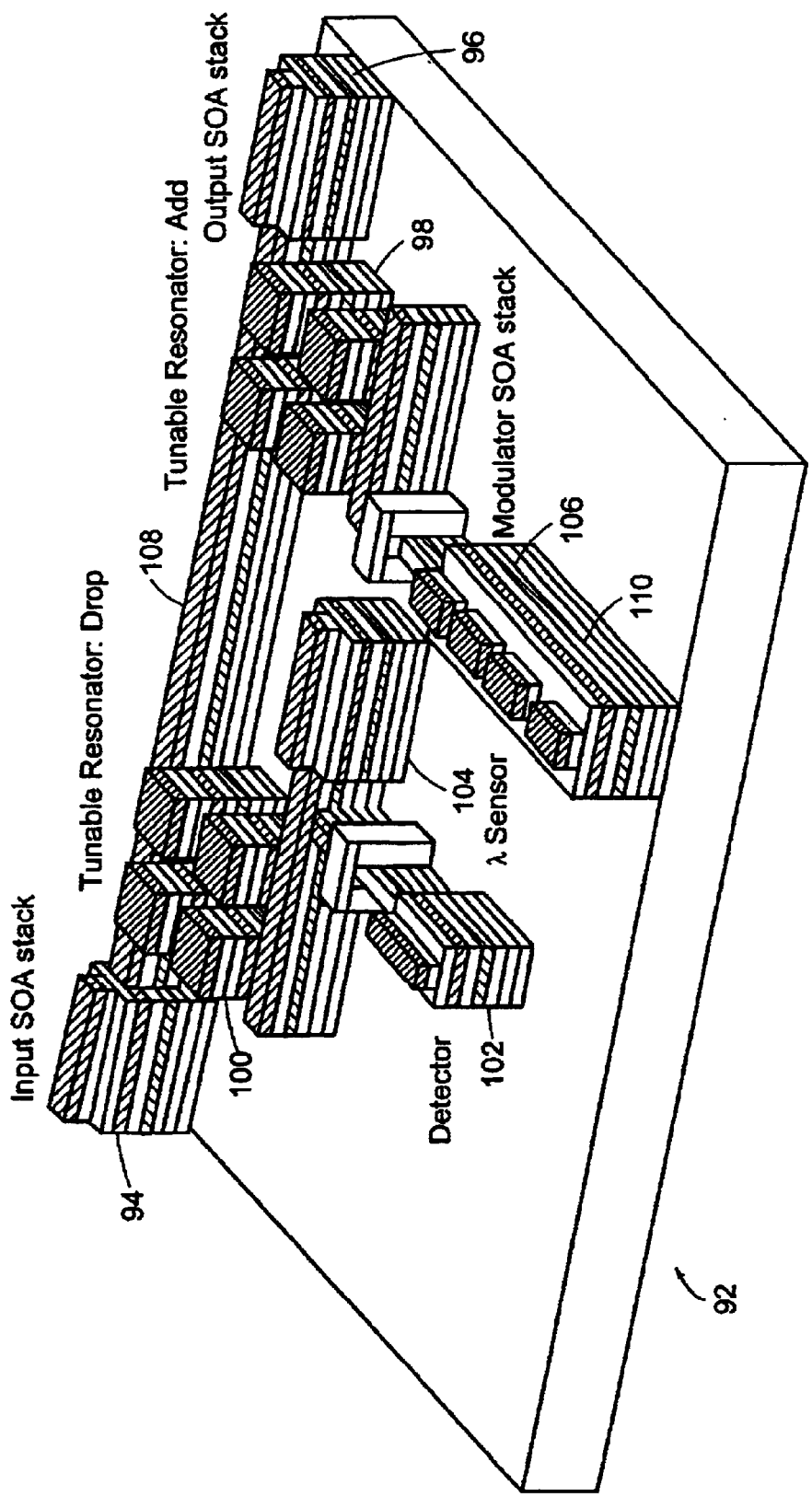
FIGS. 8A–8D are schematic block diagrams of layered structures used in accordance with the invention.

FIGS. 8A–8D are schematics of photonic circuits used in accordance with the invention. Due to the nature of the photonic circuit, the SOAs determine the basic layered structure. FIG. 8A shows a photonic circuit 92 that is created using a conventional SOA structures. The photonic circuit 92 includes an input SOA stack 94, tunable resonator drop filter 100, tunable resonator add filter 98, an output SOA stack 96, a wavelength sensor 104, input/output waveguide 108, a detector 102, a modulator 106 and a conventional tunable laser 110. A low dielectric material separates the passive waveguide and active waveguide. Depending on how the SOA is operated, they can be used as detectors, modulators, and wavelength sensors as well as input and output couplers. Furthermore, the SOA stacks can be used for the optical add/drop filters as well as the actual waveguides themselves.

Figure 8B:
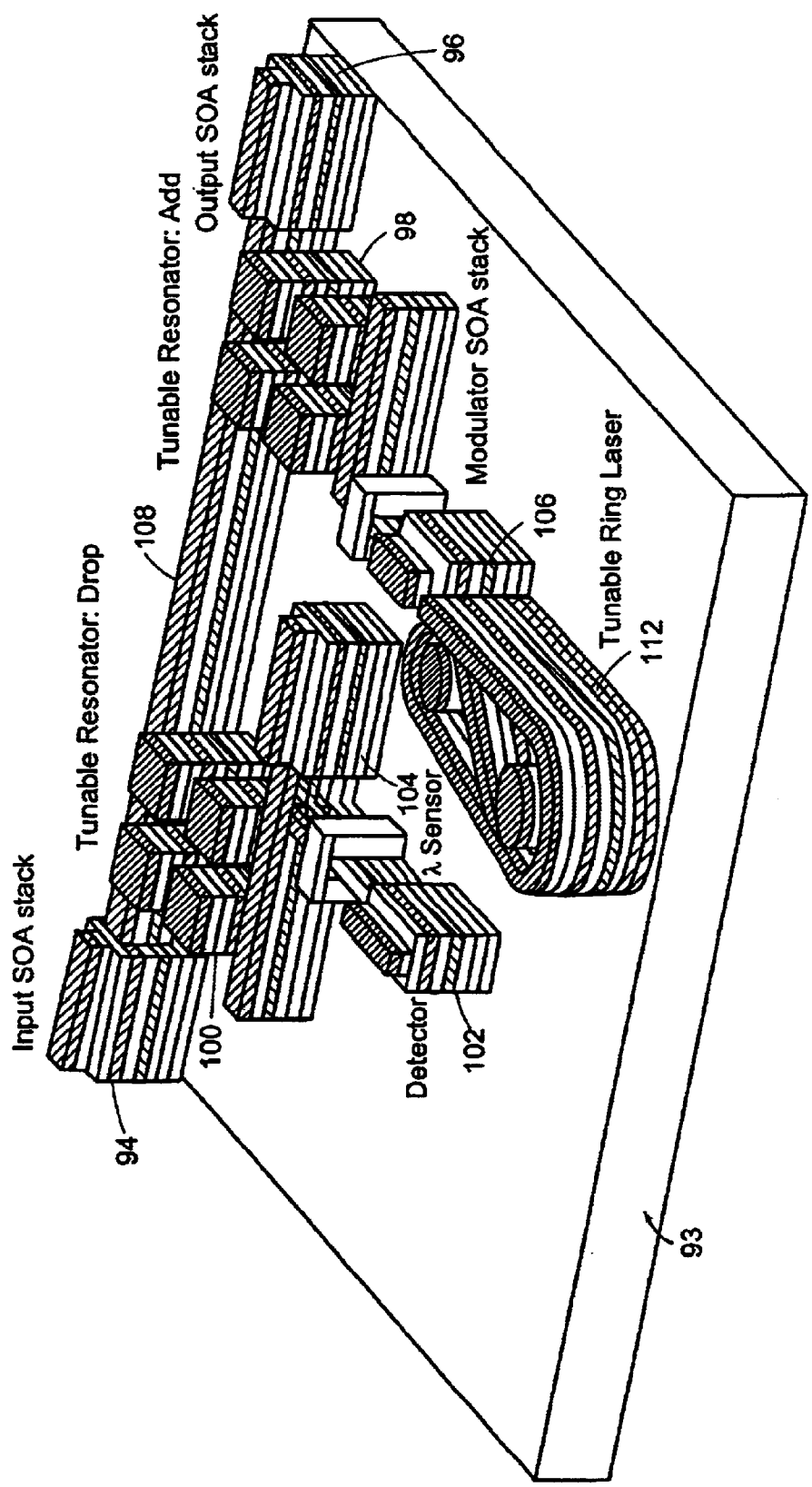

FIG. 8B shows a photonic circuit 93 that is similar to the photonic circuit 92 described in FIG. 8A. The difference is that the modulator 106 is coupled to a tunable ring laser 112. Also, a conventional SOA is used to form the components 94, 96, 98, 100, 102, 104, 106, and 112. Again, a low dielectric material separates the passive waveguide and active waveguide.

Figure 8C:
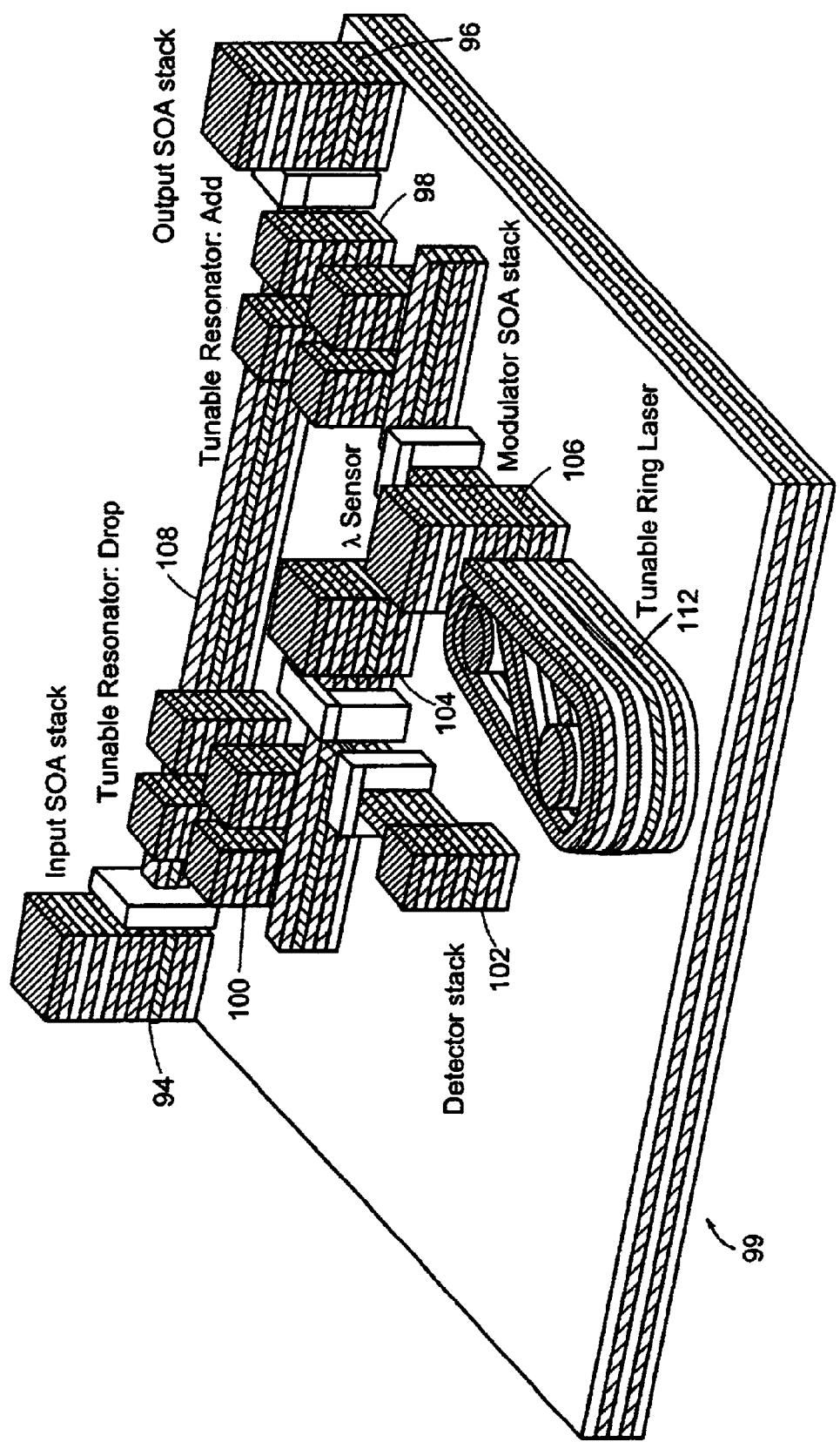

FIG. 8C shows a photonic circuit 99 that is similar to the photonic circuit 92 described in FIG. 8A. The differences are that the conventional SOAs are replaced with vertical cavity SOAs (VCSOAs), and that only the passive waveguide exists between the various photonic functional blocks signifying that the active waveguide has a higher effective index than the passive waveguide. Also, partial VCSOA stacks can be used to form the components 98, 100, 102, and 104. Again, a low dielectric material separates the passive waveguide and active waveguide.

Figure 8D:
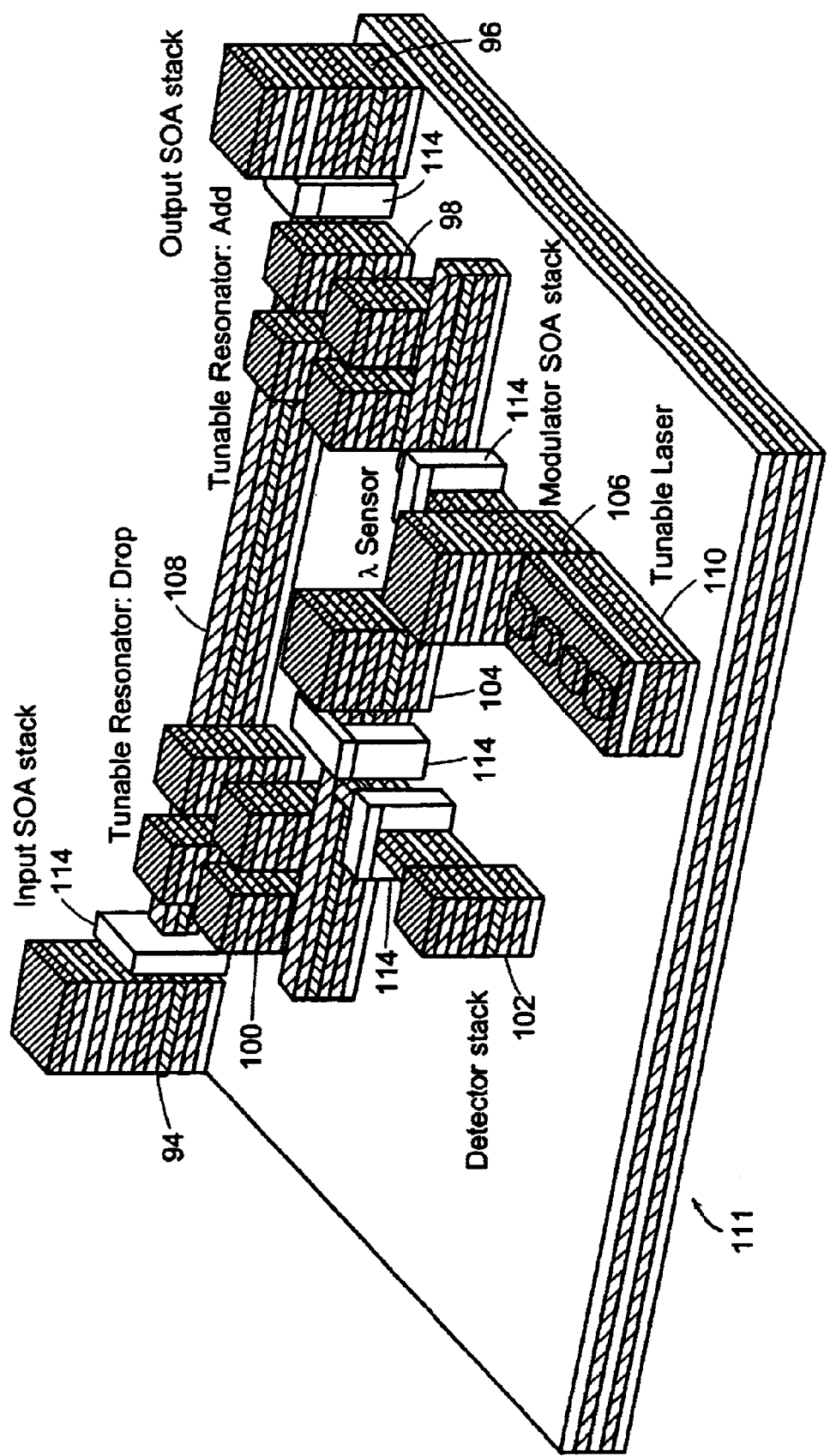

FIG. 8D shows a photonic circuit 111 that is similar to the photonic circuit 99 described in FIG. 8C. The difference is that a conventional in-plane tunable laser is implemented as opposed to the tunable ring laser. Again only the passive waveguide exists between the various photonic functional blocks signifying that the active waveguide has a higher effective index than the passive waveguide. Couplers 114 are used in conjunctions with the active components 94, 96, 102, 104, and 106 in order to couple light between the passive and active waveguides. Also, a partial VCSOA stacks are used to form the components 98, 100, 102, and 104. Again, a low dielectric material separates the passive waveguide and active waveguide.

In a GaAs-based integrated photonic circuit, a GaAs passive waveguide can be used to operate at wavelengths greater than 900 nm. An InGaAlP passive waveguide can be used for operating wavelengths less than 900 nm. For operation between 900 nm and 1300 nm, active layers can be composed of dilute nitrides, such as InGaAlAsSbN and InGaAlPSbN and their alloys, or InGaAs quantum dots. For an operating wavelength of 850 nm, the active layer can be composed of GaAs. Furthermore, GaAs-based photonic integrated circuits allow the use of aluminum oxide within the structure. Aluminum oxide has a dielectric constant of 2.56 and is formed by oxidizing high aluminum content AlGaAs.

InP-based integrated photonic circuits cover the 1300 nm to 1600 nm range of operating wavelengths. The use of antimony containing III–V material lattice matched to InP provides a means of obtaining a material with a low dielectric constant.

In accordance with another embodiment of the invention, the photonic integrated circuit is fabricated on a GaAs substrate using VCSOAs that are designed to operate at wavelengths near 1300 nm. In this embodiment, the passive waveguide includes a high dielectric material, such as GaAs, while the active waveguide includes InGaAsN quantum wells or InAs quantum dots embedded in InGaAs that are cladded with an InGaAsP alloy. Within the waveguides that route the light from one functional block to the next, the passive waveguide and adjacent aluminum oxide keeps the light confined within the passive waveguide and prevents its interaction with the active waveguide.

Figure 9:
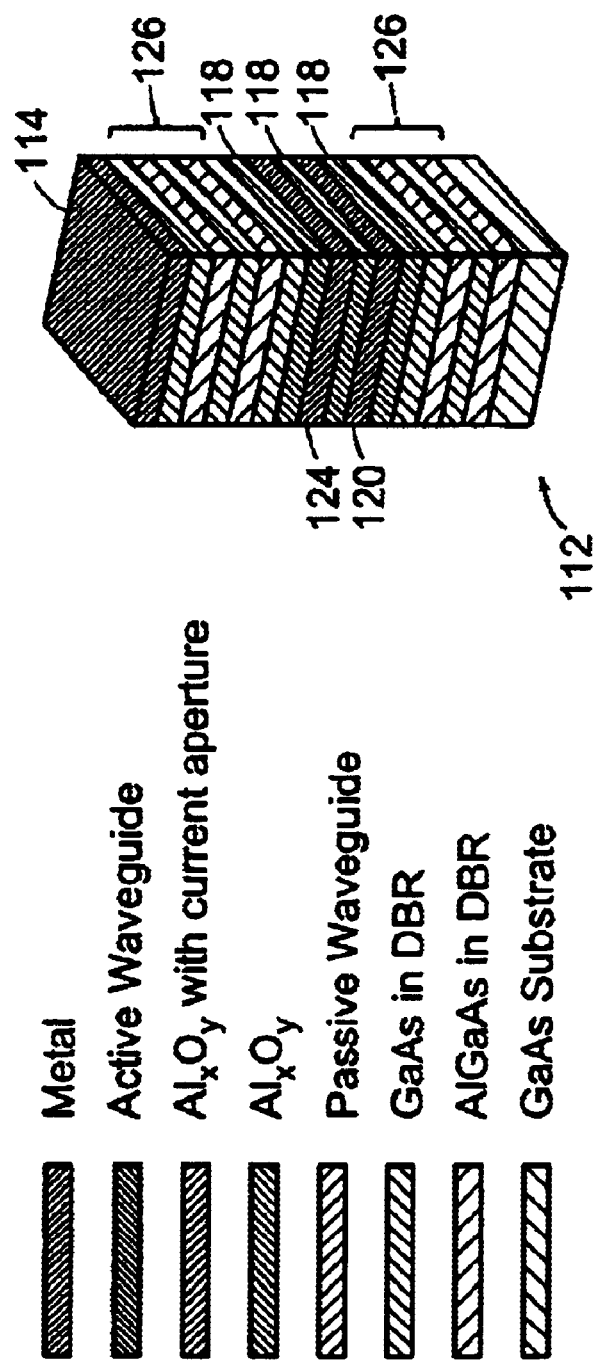
FIG. 9 is a schematic block diagram of a cross section of a GaAs-based VCSOA.

FIG. 9 is a schematic block diagram of a cross section of a GaAs-based VCSOA 112. The VCSOA 112 includes active 124 and passive 120 waveguides, a low dielectric constant layer of aluminum oxide with an AlGaAs current aperture 118, metal contact layer 114, and distributed Bragg reflectors (DBR) 126. For devices operating at 1300 nm, the active layer can consist of InGaAsN quantum wells or InGaAs quantum dots, while the passive layer can include GaAs.

In this embodiment, the VCSOA 112 includes $Al_xGa_{1-x}As/Al_yGa_{1-y}As$ DBRs 126 in which x and y are not equal surrounding the active section. One of the DBRs is doped n-type while the other DBR is doped p-type. Within the VCSOA, the active section includes both the passive and active waveguiding material, and the high aluminum containing AlGaAs layers 118 that are only partially oxidized. The use of these partially oxidized AlGaAs layers 118 forms current apertures in which the carriers that are injected into the device are funneled through. These partially oxidized layers 118 allow the light being guided within the active waveguide to enter the VCSOA without coupling to the nearby passive waveguide layer within the VCSOA stack. The thickness of each layer within the DBR stack 126 is such that for each pair of layers, the normally incident light experiences a 180-degree phase shift as light travels through the pair.

The number of pairs of layers in the DBR 126 is chosen such that the overall mirror reflectivity is nearly 100% at the wavelength of interest. Furthermore, the DBR 126 farthest from the GaAs substrate will be coated with metal 114 in order to form an ohmic contact to inject carriers into the device. A second contact for the device can be created via a backside contact across the entire wafer or via a contact to the bottom-most layers of the lower DBR stack.

Figure 10:
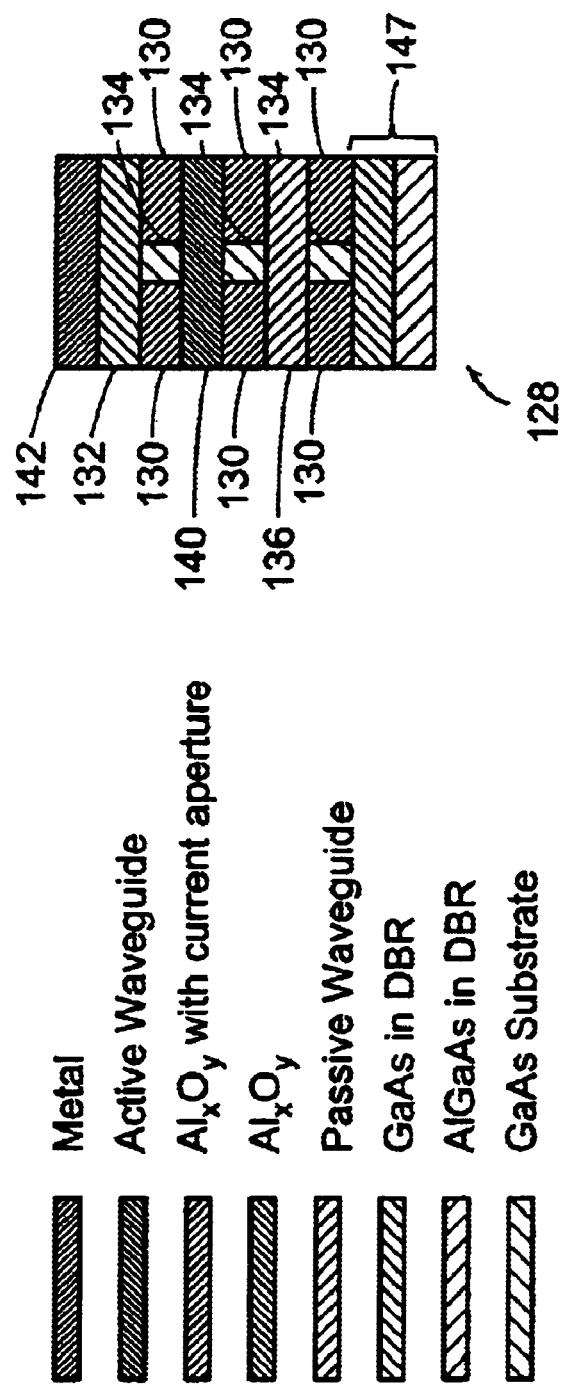
FIG. 10 is a schematic block diagram of an OADF.

FIG. 10 is a schematic block diagram of a GaAs-based OADF 128. The OADF 128 includes active 140 and passive 136 waveguides, a low dielectric constant layer 130, such as aluminum oxide, an AlGaAs current aperture layer 134, and a lower DBR layer 147. In this embodiment, the structure of the tunable OADF 128 includes basically the lower DBR 147 and the active section of the VCSOA. The lowest most layer of the upper DBR stack 132 is used as a contact layer. In the same manner as the previously described VCSOA, the high aluminum containing AlGaAs layers 134 surrounding the active 140 and passive 136 waveguides are only partially oxidized. These partially oxidized layers 134 act as current apertures and hence the OADF 128 can be tuned via current injection. The resonant modes remain confined to the passive layer within the OADF due to the high index contrast between the passive layer 136 and current apertures. The loss in the OADF 128 should be minimal as the resonant mode has a null in the center of the resonator, which is aligned with the current aperture.

Figure 11:
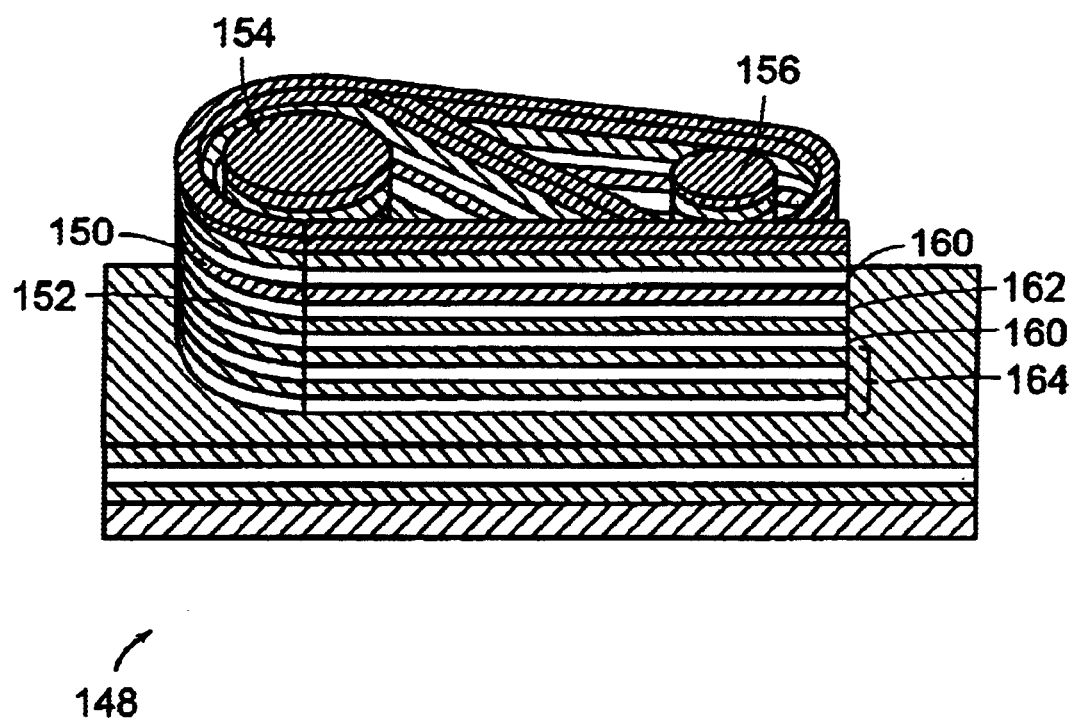
FIG. 11 is a schematic block diagram of a GaAs tunable ring laser using the layer structure of VCSOA.

FIG. 11 is a schematic block diagram of a GaAs tunable ring laser 148 using the layer structure of a VCSOA. The tunable laser 148 includes an active 150 and passive waveguides 152. The layers 160 and. 162 surrounding the active and passive waveguides are conductive AlGaAs layers that are protected during the oxidation process by a passivating material, such as silicon dioxide. Also, the tunable laser includes a lower DBR 164 and two resonators 154 and 156 that contain aluminum oxide with an AlGaAs current aperture in the center of the resonators 154 and 156. The resonators 154 and 156 can be of different sizes connected in a ring geometry, and includes the same layers as the previously described OADF 128. The current apertures above the active layer within the resonators 154 and 156 are circularly symmetric and are aligned with the main axis of the ring. This allows current to be directly injected into the active region while at the same time maintaining high index contrast between the various layers. By injecting current into the resonators, the effective dielectric constant of the resonator can be varied in the same manner as in the OADF 128. Also, by varying the resonant frequency, the resulting emission wavelength of the laser is varied. Finally the waveguide connecting the top and bottom of the ring in a diagonal fashion is used to promote the CCW propagating guided light within the laser.

Figure 12A:
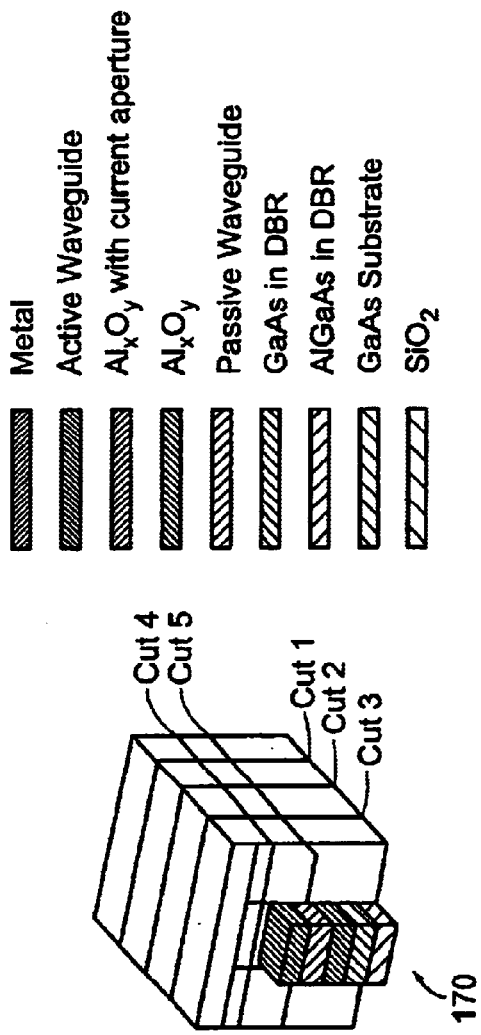
FIGS. 12A and 12B are schematic block diagrams of a waveguide coupling region between an active waveguide and passive waveguide.
Figure 12B:
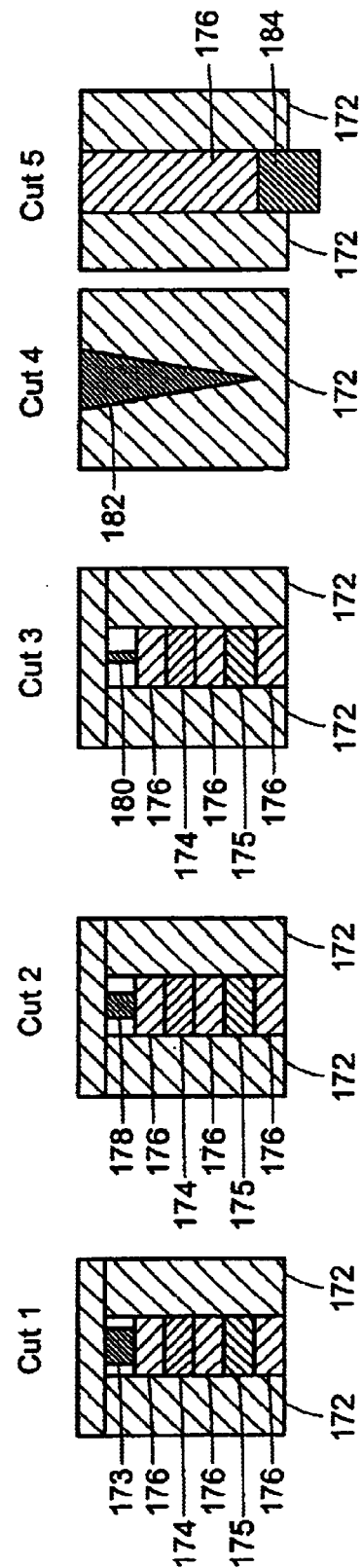

FIGS. 12A and 12B are schematic block diagrams of a waveguide coupler 170 between an active waveguide and passive waveguide. FIG. 12A shows the coupling region, which is splitted up into five cross section regions cut 1–5. FIG. 12B shows each of the cross section regions cuts 1–5. Although this figure shows the active waveguide being tapered, a variation to this coupler could have the passive waveguide being tapered if the effective dielectric constant of the passive waveguide is greater than the effective dielectric constant of the active waveguide.

In particular, cross section region cut 1 includes a $SiO_2$ layer 172 to block AlGaAs oxidation to allow for vertical coupling via the AlGaAs layer. Moreover, the cross section region cut 1 includes a passive waveguide section 174, an active waveguide section 173, and a GaAs DBR section 175. Furthermore, interposed between the sections 173, 174, and 175 are AlGaAs DBR sections 176.

Cross section region cut 2 includes a $SiO_2$ layer 172 to block AlGaAs oxidation to allow for vertical coupling via the AlGaAs. Moreover, the cross section region cut 2 includes a passive waveguide section 174, and active waveguide section 178, and a GaAs DBR section 175. Furthermore, interposed between the sections 174, 175, and 178 are AlGaAs DBR sections 176. The active waveguide section 178 is smaller than the active waveguide section 173.

Also, cross section region cut 3 includes a $SiO_2$ layer 172 to block AlGaAs oxidation to allow for vertical coupling via the AlGaAs. Moreover, the cross section region cut 3 includes a passive waveguide section 174, and active waveguide section 180, and a GaAs DBR section 175. Furthermore, interposed between the sections 174, 175, and 180 are AlGaAs DBR sections 176. The active waveguide section 180 is smaller than the active waveguide section 178.

Cross section cut 4 includes a $SiO_2$ layer 172 to block AlGaAs oxidation to allow for vertical coupling via the AlGaAs and a triangular section 182 of the active waveguide.

Cross section cut 5 includes a $SiO_2$ layer 172 to block AlGaAs oxidation to allow for vertical coupling via the AlGaAs. The AlAs DBR section 176 is interposed in the middle region of the cross section cut 4. Furthermore, cross section cut 5 includes two layers 184 of $Al_xO_y$.

The key to the coupler region is the low dielectric material surrounding the waveguide. This low dielectric material in this embodiment is shown to be silicon dioxide but other materials, such as silicon nitride, can also work. However, this material must be able to prevent the oxidation of the AlGaAs between the passive and active waveguides. Hence, this material must be deposited and patterned prior to the AlGaAs oxidation step during the fabrication of the photonic integrated circuit. In addition, the cross section of the active waveguide can be tapered laterally, vertically, or possibly a combination of both. Between the active waveguide being tapered and the AlGaAs layer, the optical signal can be transferred between the passive and active waveguides.

This embodiment with the tunable ring laser is shown in FIG. 8C while a variation of this embodiment replaces the tunable ring laser with a conventional tunable laser as shown in FIG. 8D.

In a second embodiment of the invention, the photonic integrated circuit is fabricated on an InP substrate using VCSOAs designed to operate at wavelengths between approximately 1300 nm to 1600 nm as similarly shown in FIG. 8C. These VCSOAs are based on monolithic long wavelength VCSELs. In this embodiment, the passive waveguide includes of a high dielectric material such as InGaAsP with a high As content, while the active waveguide includes InGaAsP quantum wells that are cladded with a second InGaAsP alloy. Within the waveguides that route the light from one functional block to the next, the passive waveguide and the adjacent AlAsSb layer keeps the light confined within the passive waveguide, and prevents its interaction with the active waveguide.

Figure 13:
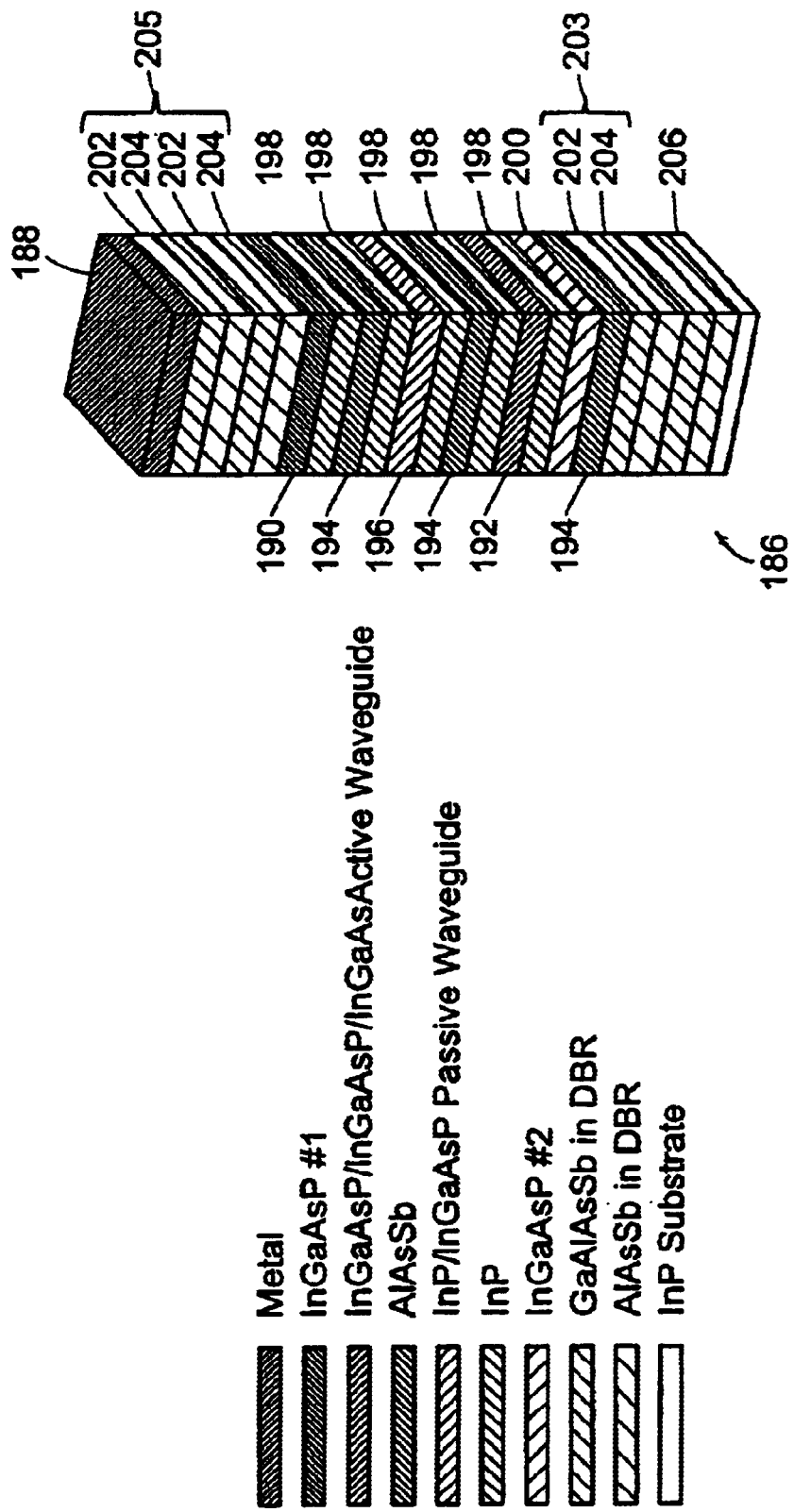
FIG. 13 is a schematic block diagram of an InP-based VCSOA.

FIG. 13 is a schematic block diagram of an InP-based VCSOA 186. The VCSOA 186 includes a metal contact layer 188, a first InGaAsP layer 190, an InGaAsP/InGaAsP/InGaAs active waveguide 192, an InP/InGaAsP passive waveguide 196, AlAsSb layers 194, InP layers 198, a second InGaAsP layer 200, a GaAlAsSb DBR layer 202, an AlAsSb DBR layer 204, and an InP substrate layer 206. The low dielectric constant AlAsSb layers 194 separate the active 192 and passive 196 waveguides as shown. Both the active 192 and passive 196 waveguides are cladded by InP layers 198. Due to the poor valence band alignment between AlAsSb layers 194 and GaAlAsSb layers 202 within the DBR, a slightly different embodiment uses a tunnel junction within the VCSOA stack, which allows both DBRs to be doped n-type to improve the performance of the device. Hence, the InGaAsP layer 190 immediately beneath the upper DBR 203 contains a tunnel junction, which allows both antimony containing DBR layers 202 and 204 to be doped n-type.

In this embodiment of the VCSOA, the AlAsSb DBR layer 204 and GaAlAsSb DBR layer 202 surround the active section, while the active section includes both active and passive waveguiding materials. The thickness of each layer within the DBR stack 203 or 205 is such that for each pair of layers, the normally incident light experiences a 180-degree phase shift as the light travels through the pair. The number of pairs of layers in the DBR 203 or 205 is chosen such that the overall mirror reflectivity is nearly 100% at the wavelength of interest. Furthermore, the DBR 205 farthest from the InP substrate will be coated with metal in order to form an ohmic contact at the top of the device, while a contact to the bottom-most layers of the lower DBR stack is accomplished by making an ohmic contact to the substrate.

Figure 14:
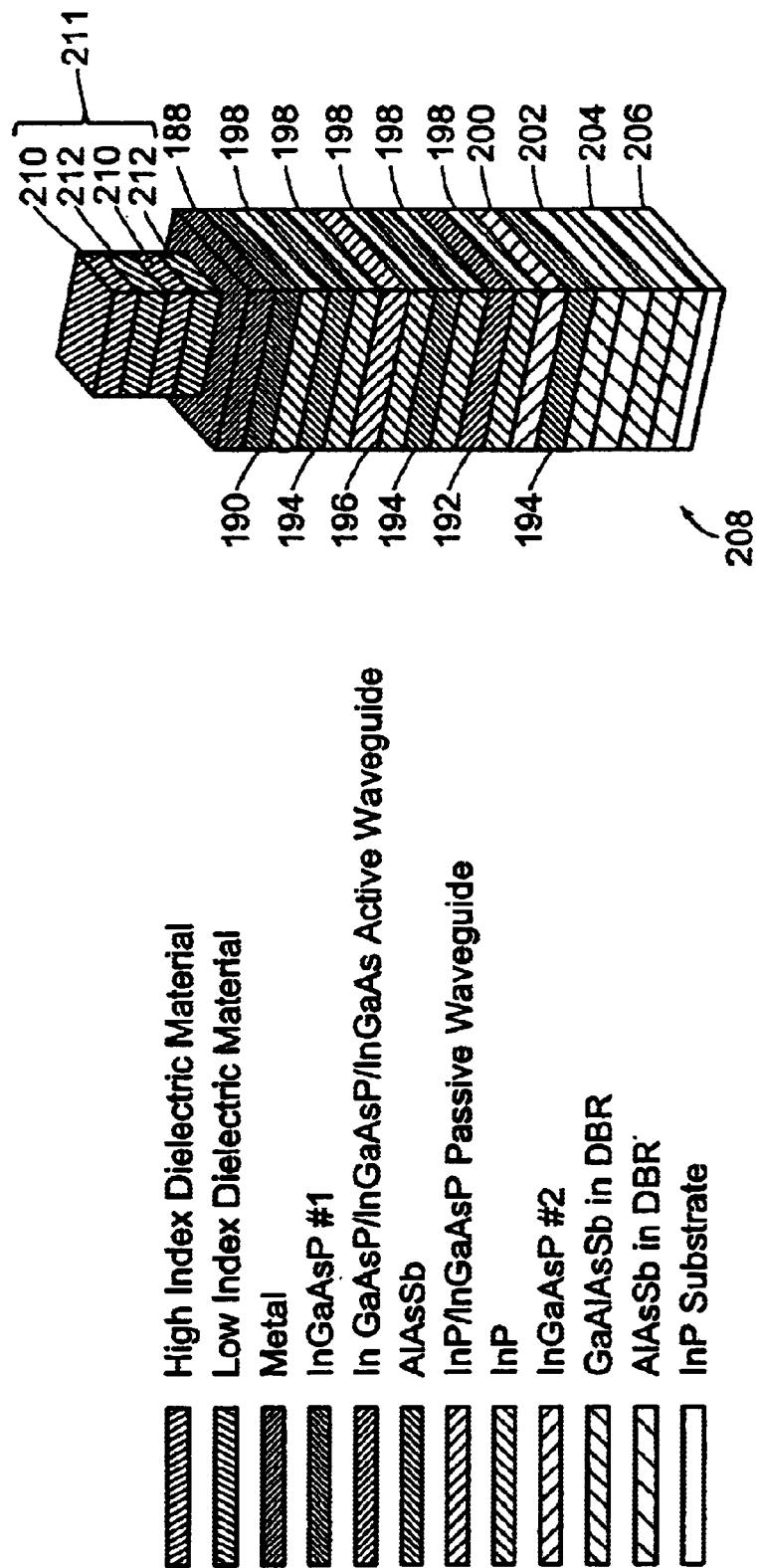
FIG. 14 is a schematic block diagram of another embodiment of a VCSOA used in accordance with second embodiment of the invention.

FIG. 14 is a schematic block diagram of an embodiment of a VCSOA 208 used in accordance with a second embodiment of the InP VCSOA. The VCSOA 208 is similar to the VCSOA 186 described previously in FIG. 13. In particular, the VCSOA includes a metal contact layer 188, a first InGaAsP layer 190, an InGaAsP/InGaAsP/InGaAs active waveguide 192, InP/InGaAsP passive waveguide 196, AlAsSb layers 194, InP layers 198, a second InGaAsP layer 200, a GaAlAsSb DBR layer 202, an AlAsSb DBR layer 204, and an InP substrate layer 206. Furthermore, the VCSOA 208 also includes an upper dielectric mirror stack 211. The dielectric stack further includes alternating layers 210 and 212 of high index dielectric material and low index dielectric material.

Figure 15:
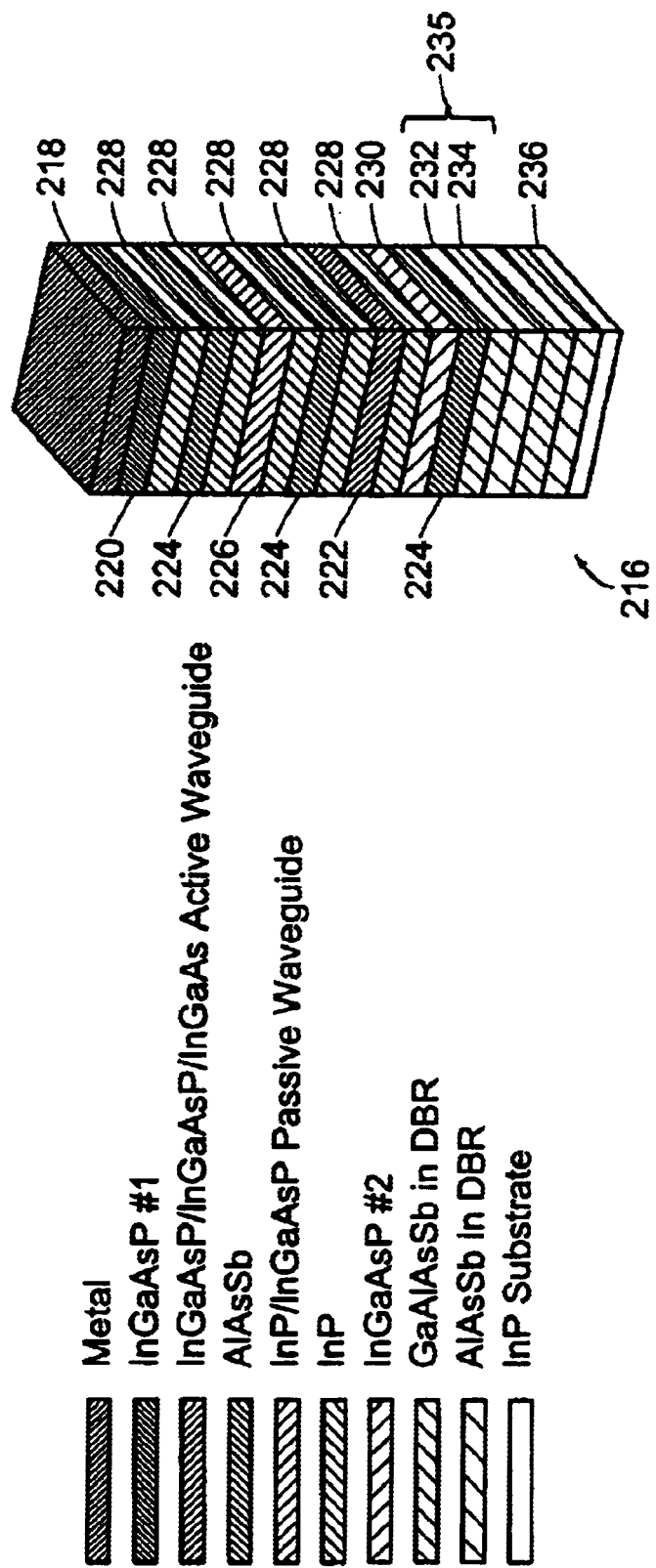
FIG. 15 is a schematic block diagram of a cross section of an InP-based OADF used in accordance with second embodiment of the invention.

FIG. 15 is a schematic block diagram of a cross section of an InP-based OADF 216 used in accordance with the second embodiment of the invention. The OADF 216 includes a metal contact layer 218, a first InGaAsP layer 220, an InGaAsP/InGaAsP/InGaAs active waveguide 222, an AlAsSb layer 224, an InP/InGaAsP passive waveguide 226, an InP layer 228, a second InGaAsP layer 230, a GaAlAsSb DBR layer 232, an AlAsSb DBR layer 234, and an InP substrate layer 236. The material comprising the passive waveguide 226 also serves as the resonator for the optical add/drop filter (OADF). The lower DBR 235 is composed of alternating layers 232 and 234 of AlGaAsSb and AlAsSb. In addition, the low dielectric constant AlAsSb material separates the active and passive waveguides. The lowest most layer of the upper DBR stack InGaAsP #1 layer 220 is used to create an ohmic contact with the metal layer 218.

As in the same manner as with the VCSOA, the AlAsSb layers surround the active 222 and passive 226 waveguides. The resonant modes remain confined to the passive layer of the OADF 216 due to the high index contrast between the passive waveguide 226 and the AlAsSb layer 224. The loss in the OADF 216 should be minimal as the resonant mode has a null in the center of the resonator, which is aligned with the metal contact 218 and hence the current injection.

Figure 16:
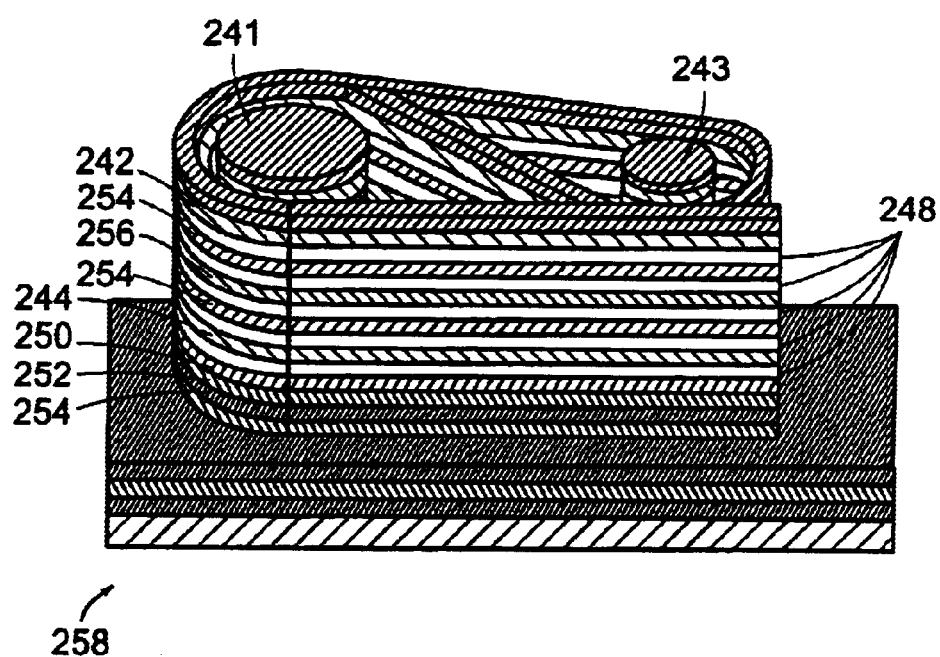
FIG. 16 is a schematic block diagram of a tunable laser used in accordance with the second embodiment of the invention.

FIG. 16 is a schematic block diagram of a tunable laser used in accordance with the second embodiment of the invention. The tunable laser includes an InGaAsP/InGaAs active 244 and an InGaAsP passive 256 waveguides, a lower DBR layer with alternating layers 252 and 254 of AlGaAsSb and AlAsSb, respectively, a first InGaAsP layer 242, a second InGaAsP layer 250, and InP layers 248. The low dielectric material AlAsSb material separates the active and passive waveguides. Both the active 244 and passive 246 waveguides are cladded by InP. The first InGaAsP layer 242 immediately above the passive waveguiding region provides a low resistive layer in order to create an ohmic contact with the metal layer. The different sized resonators 241 and 243 and the ring geometry allow the emission wavelength of the laser to be varied.

Figure 17:
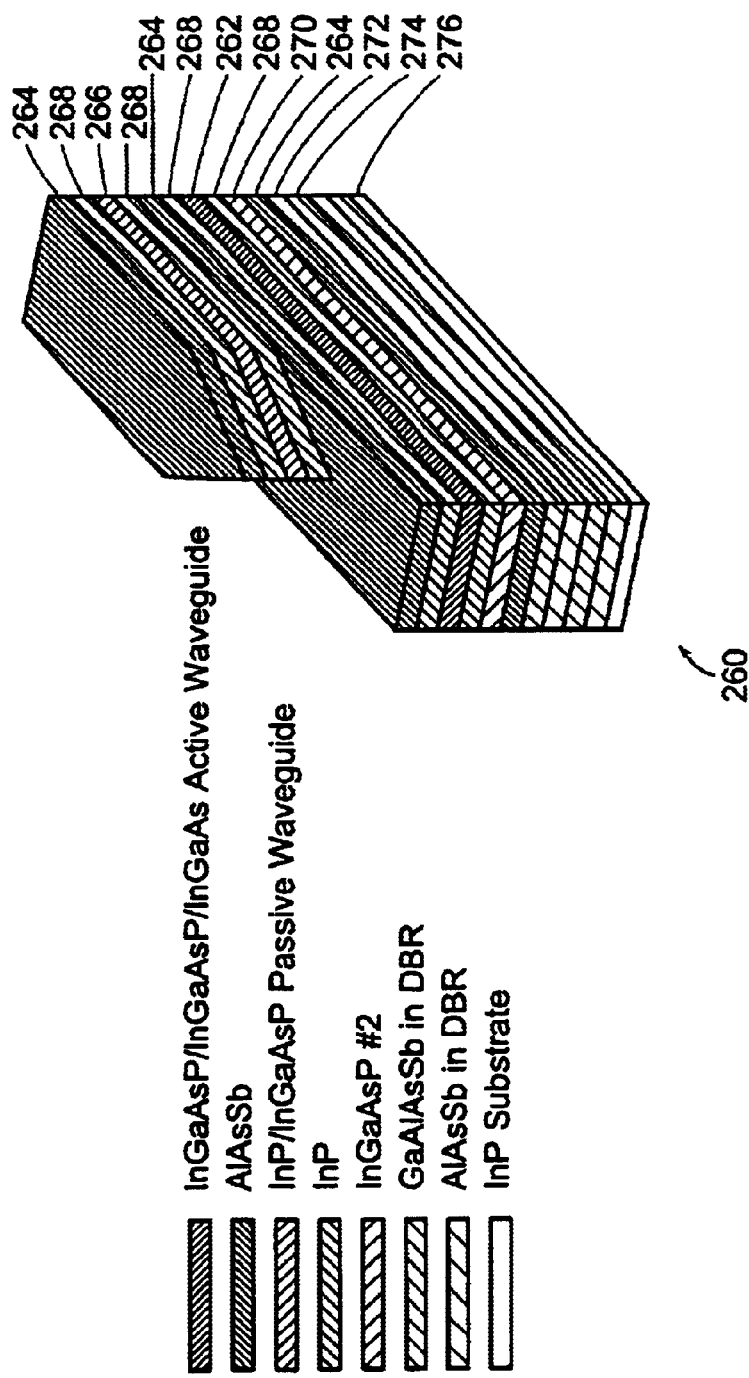
FIG. 17 is a schematic block diagram of a coupler used in accordance with the invention.

FIG. 17 is a schematic block diagram of an InP-based coupler 260 used in accordance with the invention. The coupler 260 includes an InGaAsP/InGaAsP/InGaAs active waveguide 262, an AlAsSb layer 264, an InP/InGaAsP passive waveguide 266, InP layer 268, an InGaAsP layer 270, a GaAlAsSb DBR layer 272, an AlAsSb DBR layer 274, and an InP substrate 276. The lower DBR are composed of the alternating layers 272 and 274 of AlGaAsSb and AlAsSb. The low dielectric constant AlAsSb layer separates the active 262 and passive 264 waveguides. Both the active 262 and passive 264 waveguides are cladded by InP. The passive waveguide 264 is laterally tapered to allow the passive waveguide to couple to the active waveguide. The cross section of the coupler 260 can also be tapered vertically. Between the passive waveguide 266 being tapered and the AlAsSb layer 264, the optical signal can be transferred between the passive and active waveguides.

In a third embodiment of the invention, the photonic integrated circuit is fabricated on a GaAs substrate using an in-plane SOAs designed to operate at wavelengths near 1300 nm as similarly shown in FIGS. 8A and 8B. Also, the passive waveguide includes a high dielectric constant material, such as GaAs, while the active waveguide includes InGaAsN quantum wells or InAs quantum dots embedded in InGaAs that are cladded with an InGaAsP alloy. Within the waveguides that route the light from one functional block to the next, the passive waveguide is separated from the active waveguide by a layer of oxidized AlAs. The high index contrast between the passive waveguide and adjacent aluminum oxide keeps the light confined within the passive waveguide and prevents its interaction with the active waveguide.

The SOA of this embodiment includes active and passive waveguides surrounded by cladding material. The cladding material can be composed of an (In, Ga, Al) (As, P) alloy that has a low dielectric constant and which surrounds both the passive and active waveguides. The AlGaAs layer separating the active and passive waveguides is not oxidized within the SOA and hence is conductive. This is in contrast to the waveguides between the functional blocks in which this AlGaAs layer is oxidized to form the low dielectric constant material needed to optically separate the passive and active waveguides. Electrical contact to the device can be accomplished via a backside contact across the entire wafer or via a contact to the bottom-most layer of the device and via a front side contact.

The OADF of this embodiment is identical to the SOA with the exception that the AlGaAs layer between the waveguides is partially oxidized. These partially oxidized AlGaAs layers act as current apertures and hence the OADF can be tuned via current injection. The resonant modes remain confined to the passive layer within the OADF due to the high index contrast between the passive layer and the current apertures. The loss in the OADF should be minimal as the resonant mode has a null in the center of the resonator, which is aligned with the current aperture.

The tunable laser of this embodiment includes two side-coupled resonators of different sizes connected in a ring geometry as shown in FIG. 11 but without the lower DBR stack 164. The ring part of the tunable laser is identical to the SOA, while the resonators are identical to the OADF. By injecting current into the resonators, the effective dielectric constant of the resonator can be modified as in the same manner as in the OADF. By varying the resonant frequency, the resulting emission wavelength of the laser is varied. Finally, the waveguide connecting the top and bottom of the ring in a diagonal fashion is used to promote the CCW propagating guided light within the laser.

The coupler of this embodiment includes an unoxidized, high-aluminum-containing AlGaAs layer between the passive waveguide and the active waveguide. The key to the coupler is the low dielectric material surrounding the waveguide. This material must be able to prevent oxidation of the AlGaAs between the passive and active waveguides. Hence, this material must be deposited and patterned prior to the AlGaAs oxidation step during the fabrication of the photonic integrated circuit. In addition, the cross section of the active waveguide is tapered, either laterally, vertically, or possibly a combination of both. Between the active waveguide being tapered and the AlGaAs layer, the optical signal can be transferred between the passive waveguide and the active waveguide.

In a fourth embodiment of the invention, the photonic integrated circuit is fabricated on an InP substrate using SOAs designed to operate at wavelengths between approximately 1300 nm and 1600 nm as similarly shown in FIGS. 8A and 8B. The passive waveguide includes a high dielectric material, such as InGaAsP, with a high As content, while the active waveguide includes InGaAsP quantum wells that are cladded with a second InGaAsP alloy. Within the waveguides that route the light from one functional block to the next, the passive waveguide is separated from the active waveguide by the AlAsSb layer. The high index contrast between the passive waveguide and the adjacent AlAsSb layers keeps the light confined within the passive waveguide and prevents its interaction with the active waveguide.

The SOA of this embodiment includes the active and passive waveguides surrounded by cladding material. The cladding material can be composed of an (In, Ga) (As, P) alloy as a low dielectric material, which surrounds both waveguides. Contact to the SOA is made at the top of the upper cladding layer and at the bottom-most layer of the device.

The OADF of this embodiment is identical, to the SOA. The OADF can be tuned via current injection. The resonant modes remain confined to the passive layer within the OADF due to the high index contrast between the passive layer and the low dielectric constant AlAsSb layers. The loss in the OADF can be minimal as the resonant mode has a null in the center of the resonator, which can be aligned with the metal contact.

The tunable laser of this embodiment includes two-sided resonators of different sizes connected in a ring geometry as shown in FIG. 11 but without the lower DBR stack 164. The ring part of the tunable laser is identical to the SOA, while the resonators are identical to the OADF. By injecting current into the resonators, the effective dielectric constant of the resonator can be modified in the same manner as in the OADF. By varying the resonant frequency, the resulting emission wavelength of the laser is varied. The waveguide connecting the top and bottom of the ring in a diagonal fashion is used to promote the CCW propagating guided light within the laser.

The invention relates to the creation of an integrated photonic circuit including tunable add/drop filters, a detector, a wavelength sensor, a modulator, and a tunable laser for use in telecommunication systems and networks. The photonic integrated circuit allows the addition and removal of any wavelength within a wavelength division multiplex data stream. The added signal from an integrated tunable laser is modulated via an integrated modulator, while the removed wavelength is converted to an electrical signal via an integrated detector.

Although the present invention has been shown and described with respect to several preferred embodiments thereof, various changes, omissions and additions to the form and detail thereof, may be made therein, without departing from the spirit and scope of the invention.

What is claimed is:

1. A photonic circuit comprising:
    a tunable drop filter arrangement that includes a plurality of resonators, said drop filter arrangement removing a dropped resonant frequency from an input data stream;
    a detector is coupled to said tunable drop filter to detect all dropped resonant frequencies of said tunable drop filter; and
    a wavelength sensor coupled to said drop filter to monitor the dropped resonant frequency associated with said tunable drop filter arrangement.

2. The photonic circuit of claim 1 further comprising an input/output waveguide coupled to tunable drop filter.

3. The photonic circuit of claim 2, wherein said input/output waveguide comprises passive and active sections.

4. The photonic circuit of claim 1, wherein said tunable drop filter comprises an even number of resonators.

5. The photonic circuit of claim 1, wherein said resonators are evanescently coupled to each other.

6. The photonic circuit of claim 1, wherein said detector is electrically biased to absorb light.

7. The photonic circuit of claim 1, wherein said wavelength sensor is electrically biased to absorb light.

8. The photonic circuit of claim 7, wherein said bias is modulated so as to modulate the absorption of light propagating in an active section of said wavelength sensor.

9. The photonic circuit of claim 8, wherein said amount of absorption within the active section modifies the electrical behavior of said wavelength sensor.

10. A device for operating on an optical signal comprising:
    a tunable drop filter arrangement that includes a plurality of resonators, said drop filter arrangement removing a frequency from an input data stream;
    a detector is coupled to said tunable drop filter to detect all dropped resonant frequencies of said tunable drop filter; and
    a wavelength sensor coupled to said drop filter to monitor the selected frequency to which the tunable drop filter arrangement has been tuned.

11. The device of claim 10 further comprising an input/output waveguide coupled to said tunable drop filter.

12. The device of claim 11, wherein said input/output waveguide comprises passive and active sections.

13. The device of claim 10, wherein said tunable drop filter comprises an even number of resonators.

14. The device of claim 10, wherein said resonators are evanescently coupled to each other.

15. The device of claim 10, wherein said detector is electrically biased to absorb light.

16. The device of claim 10, wherein said wavelength sensor is electrically biased to absorb light.

17. The device of claim 16, wherein said bias is modulated so as to modulate the absorption of light propagating in an active section of said wavelength sensor.

18. The device of claim 17, wherein said amount of absorption within the active section modifies the electrical behavior of said wavelength sensor.

19. A method of dropping a resonant frequency from an input stream using a photonic circuit, said method comprising:
    providing a tunable drop filter arrangement that includes a plurality of resonators, said drop filter arrangement dropping a dropped resonant frequency from said input data stream;
    providing a detector is coupled to said tunable drop filter to detect all dropped resonant frequencies of said tunable drop filter
    providing a wavelength sensor that is coupled to said drop filter so that it monitors the dropped resonant frequency associated with said tunable drop filter.

20. The method of claim 19 further comprising providing an input/output waveguide that is coupled to tunable drop filter.

21. The method of claim 20, wherein said input/output waveguide comprises a passive and active sections.

22. The method of claim 19, wherein said tunable drop filter comprises an even number of resonators.

23. The method of claim 19, wherein said resonators are evanescently coupled to each other.

24. The method of claim 19, wherein said detector is electrically biased to absorb light.

25. The method of claim 19, wherein said wavelength sensor is electrically biased to absorb light.

26. The method of claim 25, wherein said bias is modulated so as to modulate the absorption of light propagating in an active section of said wavelength sensor.

27. The method of claim 26, wherein said amount of absorption within the active section modifies the electrical behavior of said wavelength sensor.

* * * * *